US012581199B2

(12) United States Patent
Ishihara et al.

(10) Patent No.: US 12,581,199 B2
(45) Date of Patent: Mar. 17, 2026

(54) DETECTION DEVICE

(71) Applicant: Magnolia White Corporation, Tokyo (JP)

(72) Inventors: Tomoyuki Ishihara, Tokyo (JP); Tomoya Tezen, Tokyo (JP); Daisuke Hamano, Tokyo (JP); Naoyuki Asano, Tokyo (JP); Kaoru Ito, Tokyo (JP); Akihiko Fujisawa, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 190 days.

(21) Appl. No.: 18/607,801

(22) Filed: Mar. 18, 2024

(65) Prior Publication Data

US 2024/0323543 A1 Sep. 26, 2024

(30) Foreign Application Priority Data

Mar. 23, 2023 (JP) ................................. 2023-046312

(51) Int. Cl.
| | |
|---|---|
| *H04N 23/72* | (2023.01) |
| *H04N 5/262* | (2006.01) |
| *H04N 5/265* | (2006.01) |
| *H04N 23/71* | (2023.01) |
| *H04N 23/74* | (2023.01) |
| *H04N 23/76* | (2023.01) |
| *H10F 39/18* | (2025.01) |

(52) U.S. Cl.
CPC ........... *H04N 23/72* (2023.01); *H04N 5/2628* (2013.01); *H04N 5/265* (2013.01); *H04N*

*23/71* (2023.01); *H04N 23/74* (2023.01); *H04N 23/76* (2023.01); *H10F 39/182* (2025.01)

(58) Field of Classification Search
CPC ...... H04N 23/72; H04N 5/2628; H04N 5/265; H04N 23/71; H04N 23/74; H04N 23/76; H10F 39/182
See application file for complete search history.

(56) References Cited

U.S. PATENT DOCUMENTS

| | | | | |
|---|---|---|---|---|
| 2016/0330389 | A1* | 11/2016 | Adachi | .............. G02B 21/0008 |
| 2019/0137753 | A1* | 5/2019 | Chan | ..................... H04N 23/90 |

FOREIGN PATENT DOCUMENTS

JP 2018-033430 A 3/2018

* cited by examiner

*Primary Examiner* — Tony Ko
(74) *Attorney, Agent, or Firm* — K&L Gates LLP

(57) ABSTRACT

According to an aspect, a detection device includes: a planar detection device including photodetection elements arranged in a planar configuration; a light-transmitting placement substrate to place thereon objects to be detected; and light sources provided correspondingly to the photodetection elements. The planar detection device, the placement substrate, and the light sources are arranged in the order as listed. The light sources include first light sources that are separately arranged and second light sources that are arranged adjacent to the respective first light sources. The detection device has: a first period in which the first light sources are on and the second light sources are off; and a second period in which the second light sources are on and the first light sources are off. The detection device is configured to combine a first image detected in the first period with a second image detected in the second period.

20 Claims, 16 Drawing Sheets

DETECTION DEVICE

CROSS-REFERENCE TO RELATED APPLICATION

This application claims the benefit of priority from Japanese Patent Application No. 2023-046312 filed on Mar. 23, 2023, the entire contents of which are incorporated herein by reference.

BACKGROUND

1. Technical Field

What is disclosed herein relates to a detection device.

2. Description of the Related Art

Japanese Patent Application Laid-open Publication No. 2018-033430 (JP-A-2018-033430) discloses a biosensor that includes a photosensor, a culture vessel placed on top of an imaging surface of the photosensor, and a point light source disposed above the culture vessel. In the biosensor of JP-A-2018-033430, light emitted from the point light source passes through a culture medium and a plurality of objects to be detected (microbes), and enters the photosensor.

Such a detection device is required to detect the objects to be detected in a detection area having a larger area. When irradiating a larger area with one point light source, a larger distance is required between the point light source and an optical sensor (photosensor in JP-A-2018-033430), which makes an entire device larger in size. If a surface light source (a planar light source) is used, the surface light source emits light in directions different from one another to one object to be detected, which may blur an image captured by the optical sensor.

For the foregoing reasons, there is a need for a detection device capable of improving the detection accuracy.

SUMMARY

According to an aspect, a detection device includes: a planar detection device including a plurality of photodetection elements arranged in a planar configuration; a light-transmitting placement substrate to place thereon a plurality of objects to be detected; and a plurality of light sources provided correspondingly to the photodetection elements. The planar detection device, the placement substrate, and the light sources are arranged in the order as listed. The light sources include a plurality of first light sources that are separately arranged and a plurality of second light sources that are arranged adjacent to the respective first light sources. The detection device has: a first period in which the first light sources are on and the second light sources are off; and a second period in which the second light sources are on and the first light sources are off. The detection device is configured to combine a first image detected by the planar detection device in the first period with a second image detected by the planar detection device in the second period.

BRIEF DESCRIPTION OF THE DRAWINGS

FIG. 12 illustrates explanatory views for explaining a method for generating an entire image by combining the divided images;

FIG. 14 illustrates explanatory views for explaining a method for generating the entire image by combining the divided images in the detection device according to the modification;

DETAILED DESCRIPTION

Figure 1:
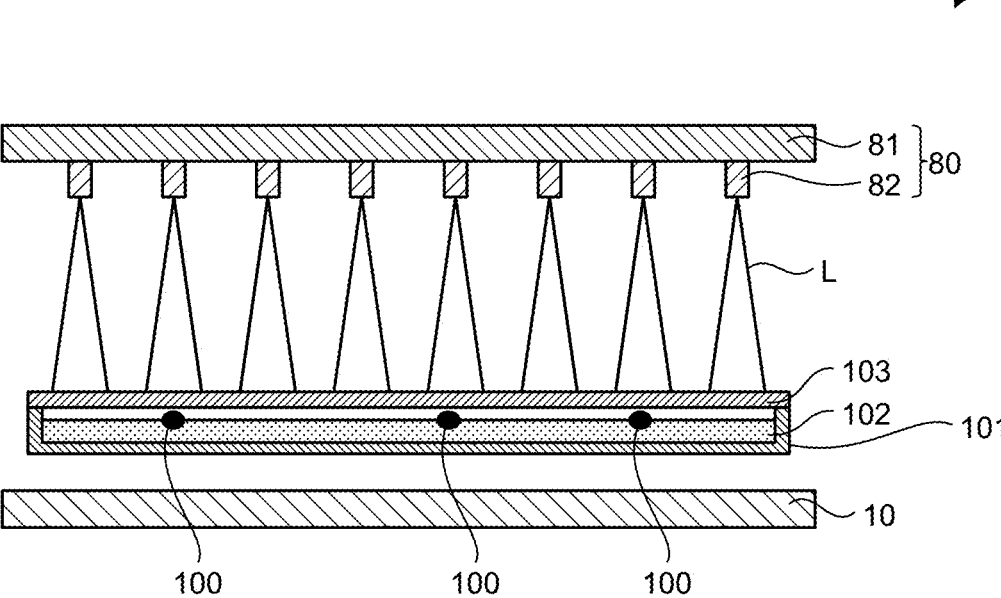
FIG. 1 is a sectional view schematically illustrating a detection device according to a first embodiment.

The following describes modes (embodiments) for carrying out the present disclosure in detail with reference to the drawings. The present disclosure is not limited to the description of the embodiments given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the present disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the present disclosure and the drawings, and detailed description thereof may not be repeated where appropriate.

In the present specification and claims, in expressing an aspect of disposing another structure on or above a certain structure, a case of simply expressing "on" includes both a case of disposing the other structure immediately on the certain structure so as to contact the certain structure and a case of disposing the other structure above the certain structure with still another structure interposed therebetween, unless otherwise specified.

First Embodiment

FIG. 1 is a sectional view schematically illustrating a detection device according to a first embodiment. As illustrated in FIG. 1, a detection device 1 includes an optical sensor 10, a placement substrate 101 and a cover member 103 for placing an object to be detected 100, and a light source device 80. The placement substrate 101 and the cover member 103 (object to be detected 100), and the light source device 80 are placed in this order above the optical sensor 10.

The object to be detected 100 is a micro-object such as a bacterium. The detection device 1 is a biosensor that detects the micro-object such as the bacterium. The placement substrate 101 is a light-transmitting plate-like member formed of glass, for example. A plurality of the objects to be detected 100 are placed together with a culture medium 102 on the placement substrate 101. The cover member 103 covering the objects to be detected 100 is provided on the upper side of the placement substrate 101. The placement substrate 101 and the cover member 103 are a Petri dish, for example. The objects to be detected 100 serving as detection targets are placed on the placement substrate 101 and placed between the optical sensor 10 and the light source device 80.

The objects to be detected 100 are not limited to the bacteria and may be other micro-objects such as cells. The detection device 1 is not limited to a biosensor and may be configured as, for example, a fingerprint detection device that detects a fingerprint or a vein detection device that detects a vascular pattern of, for example, veins. In this case, the object to be detected 100 may be a living body such as a finger, a palm, or a wrist.

The optical sensor 10 is a planar detection device that includes a plurality of photodiodes 30 (photodetection elements) arranged in a planar configuration. A detailed configuration of the optical sensor 10 will be described later with reference to FIG. 2 and FIGS. 5 and 6. The optical sensor 10 and the placement substrate 101 are disposed in a direction orthogonal to a surface of the optical sensor 10 with a gap interposed therebetween.

The light source device 80 includes a light source substrate 81 and a plurality of light-emitting elements 82. The light-emitting elements 82 are point light sources provided correspondingly to the photodiodes 30 of the optical sensor 10. The light-emitting elements 82 are provided on the light source substrate 81 and arranged so as to face the photodiodes 30 of the optical sensor 10. The light-emitting elements 82 are each made of a light-emitting diode (LED), for example.

Light L emitted from the light-emitting elements 82 passes through the placement substrate 101, the culture medium 102, and the cover member 103, and is transmitted toward the photodiodes 30 of the optical sensor 10. The amount of light received by the photodiodes 30 differs between areas overlapping the objects to be detected 100 and areas not overlapping the objects to be detected 100. As a result, the optical sensor 10 can image the objects to be detected 100.

In the present embodiment, the light-emitting elements 82 serving as the point light sources are arranged at a predetermined pitch. As a result, compared with a case of providing a surface light source (a planar light source), the direction of the light L is restrained from varying, thus enabling better imaging. The arrangement pitch of the light-emitting elements 82 is set so as to reduce interference of the light L emitted from the adjacent light-emitting elements 82. The arrangement pitch of the photodiodes 30 is set so as to ensure a light-receiving area at the optical sensor 10. More than one of the photodiodes 30 are arranged so as to overlap one of the light-emitting elements 82. The arrangement is, however, not limited thereto. Only at least one of the photodiodes 30 needs to be provided so as to overlap one of the light-emitting elements 82.

Figure 2:
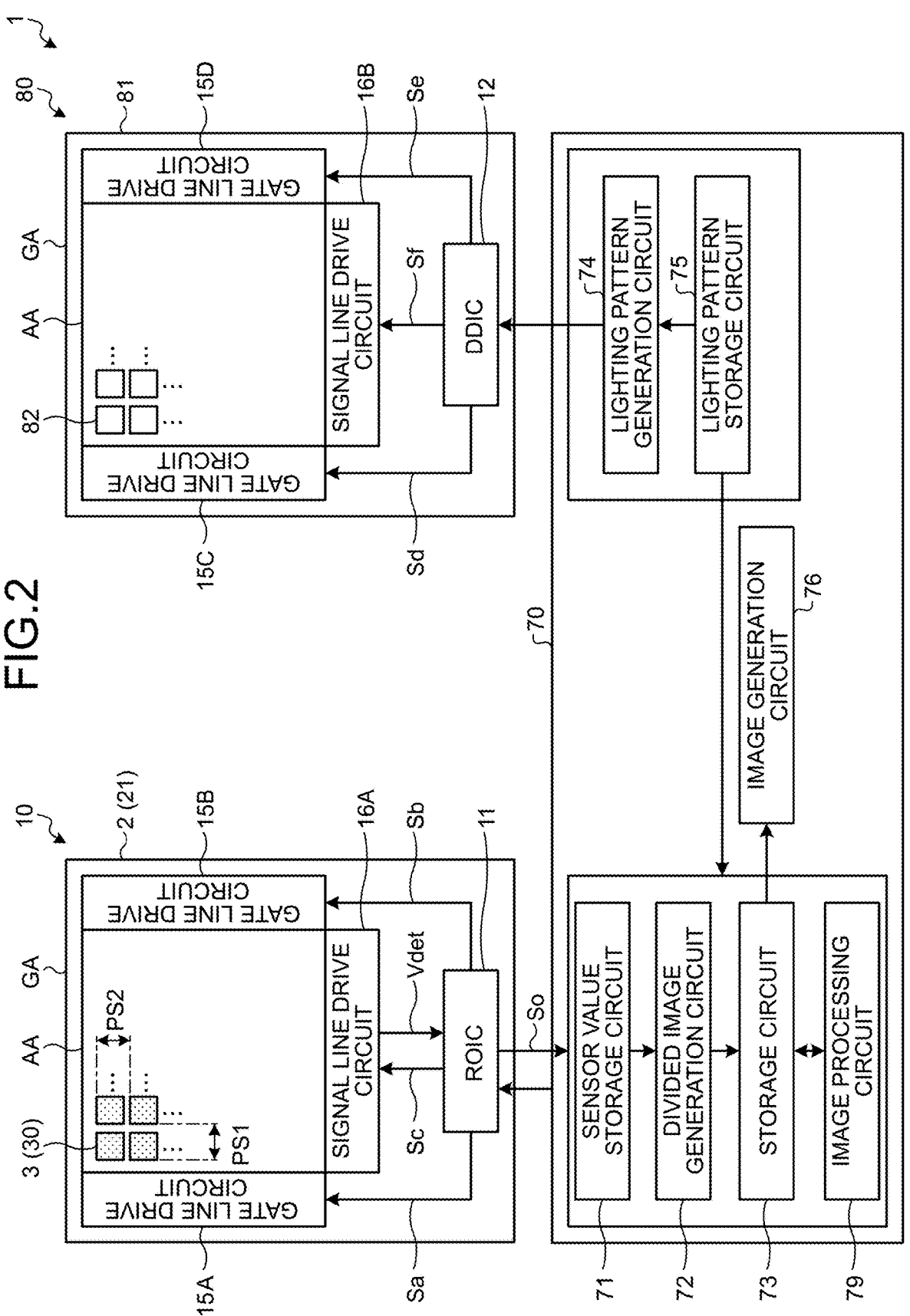
FIG. 2 is a block diagram illustrating a configuration example of the detection device according to the first embodiment.

FIG. 2 is a block diagram illustrating a configuration example of the detection device according to the first embodiment. As illustrated in FIG. 2, the detection device 1 further includes a host integrated circuit (IC) 70 that controls the optical sensor 10 and the light source device 80. The optical sensor 10 includes an array substrate 2, a plurality of sensor pixels 3 (photodiodes 30) formed on the array substrate 2, gate line drive circuits 15A and 15B, a signal line drive circuit 16A, and a detection control circuit 11.

The array substrate 2 is formed using a substrate 21 as a base. Each of the sensor pixels 3 is configured with a corresponding one of the photodiodes 30, a plurality of transistors, and various types of wiring. The array substrate 2 with the photodiodes 30 formed thereon is a drive circuit board for driving the sensor for each predetermined detection area and is also called a backplane or an active matrix substrate.

The substrate 21 has a detection area AA and a peripheral area GA. The detection area AA is an area provided with the sensor pixels 3 (photodiodes 30). The peripheral area GA is an area between the outer perimeter of the detection area AA and the outer edges of the substrate 21 and is an area not provided with the sensor pixels 3. The gate line drive circuits 15A and 15B, the signal line drive circuit 16A, and the detection control circuit 11 are provided in the peripheral area GA.

Each of the sensor pixels 3 is an optical sensor including the photodiode 30 as a sensor element. Each of the photodiodes 30 outputs an electrical signal corresponding to light emitted thereto. More specifically, the photodiode 30 is a positive-intrinsic-negative (PIN) photodiode or an organic photodiode (OPD) using an organic semiconductor. The sensor pixels 3 (photodiodes 30) are arranged in a matrix having a row-column configuration in the detection area AA.

The detection control circuit 11 is a circuit that supplies control signals Sa, Sb, and Sc to the gate line drive circuits 15A and 15B, and the signal line drive circuit 16A, respectively, to control operations of these circuits. Specifically, the gate line drive circuits 15A and 15B output gate drive signals to sensor gate lines GLS (refer to FIG. 4) based on the control signals Sa and Sb. The signal line drive circuit 16A electrically couples a sensor signal line SLS selected based on the control signal Sc to the detection control circuit 11. The detection control circuit 11 includes a signal processing circuit that performs signal processing of a detection signal Vdet from each of the photodiodes 30.

The photodiodes 30 included in the sensor pixels 3 perform detection in response to the gate drive signals supplied from the gate line drive circuits 15A and 15B. Each of the photodiodes 30 outputs the electrical signal corresponding to the light emitted thereto as the detection signal Vdet to the signal line drive circuit 16A. The detection control circuit 11 (detection circuit) is electrically coupled to the photodiodes 30. The detection control circuit 11 performs the signal processing of the detection signals Vdet from the photodiodes 30 and outputs sensor values So based on the detection signals Vdet to the host IC 70. This operation causes the detection device 1 to detect information on the object to be detected 100.

Figure 3:
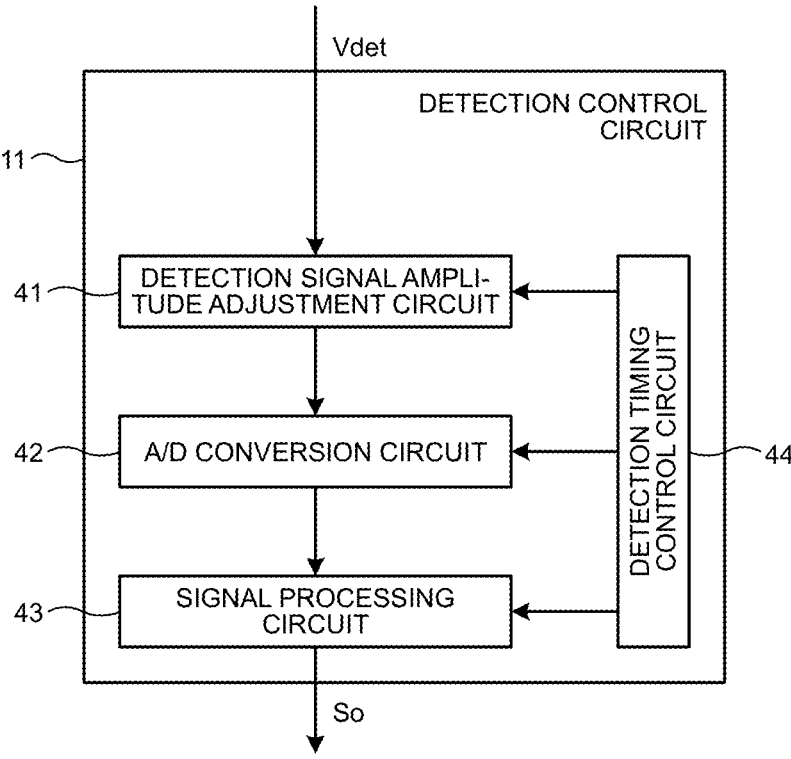
FIG. 3 is a block diagram illustrating a configuration example of a detection control circuit according to the first embodiment.

FIG. 3 is a block diagram illustrating a configuration example of the detection control circuit according to the first embodiment. As illustrated in FIG. 3, the detection control circuit 11 includes a detection signal amplitude adjustment circuit 41, an analog-to-digital (A/D) conversion circuit 42, a signal processing circuit 43, and a detection timing control circuit 44. In the detection control circuit 11, the detection timing control circuit 44 performs control to cause the detection signal amplitude adjustment circuit 41, the A/D conversion circuit 42, and the signal processing circuit 43 to operate in synchronization with one another based on a control signal supplied from the host IC 70 (refer to FIG. 2).

The detection signal amplitude adjustment circuit 41 is a circuit that adjusts the amplitude of the detection signal Vdet output from the photodiode 30 and is configured with an amplifier, for example. The A/D conversion circuit 42 converts analog signals output from the detection signal amplitude adjustment circuit 41 into digital signals. The signal processing circuit 43 is a circuit that performs signal processing of the digital signals from the A/D conversion circuit 42 and transmits the sensor values So to the host IC 70.

Referring back to FIG. 2, the light source device 80 includes the light source substrate 81, the light-emitting elements 82 formed on the light source substrate 81, gate line drive circuits 15C and 15D, a signal line drive circuit 16B, and a light-emitting element control circuit 12.

The light-emitting elements 82 are arranged in an area overlapping a detection area AA of the light source substrate 81. The light source substrate 81 is a drive circuit board for driving each of the light-emitting elements 82 to be switched between on (in a lit-up state) and off (in a non-lit state).

The light-emitting element control circuit 12 is a circuit that supplies control signals Sd, Se, and Sf to the gate line drive circuits 15C and 15D, and the signal line drive circuit 16B, respectively, to control operations of these circuits. Specifically, the gate line drive circuits 15C and 15D output drive signals to gate lines (not illustrated) based on the control signals Sd and Se, and thus select the light-emitting elements 82 in a given row. The signal line drive circuit 16B supplies a light-emitting element control signal to a selected signal line (not illustrated) based on the control signal Sf. Thus, the light source device 80 can switch each of the light-emitting elements 82 between the lit-up state (on) and the non-lit state (off).

The light source substrate 81 of the light source device 80 is what is called an active matrix substrate but is not limited thereto. Any method may be used to control on and off the light-emitting elements 82. For example, the light-emitting element control circuit 12 may individually control each of the light-emitting elements 82.

The host IC 70 synchronously controls switching lighting patterns of "on" and "off" of the light-emitting elements 82 of the light source device 80 and the detection (scanning) by the photodiodes 30 of the optical sensor 10. Specifically, the host IC 70 turns on the light-emitting elements 82 at a different on/off lighting pattern for each period and acquires a divided image IM based on the sensor values So of the photodiodes 30 for each period. A plurality of the divided images IM are combined to generate an entire image. A detection method of the detection device 1 will be described in detail later with reference to FIG. 7 and subsequent drawings.

The host IC 70 includes a sensor value storage circuit 71, a divided image generation circuit 72, a storage circuit 73, and an image processing circuit 79 as control circuits for the optical sensor 10. The sensor value storage circuit 71 stores therein the sensor values So output from the detection control circuit 11 of the optical sensor 10. The divided image generation circuit 72 generates the divided images IM by cutting out, from the image generated based on the sensor values So from the photodiodes 30, portions corresponding to irradiated areas IA of light-emitting elements 82 that are turned on out of all the light-emitting elements 82. A processor may perform processes of the divided image generation circuit 72, the image processing circuit 79, and an image generation circuit 76 using computer software.

The storage circuit 73 stores therein the divided images IM in association with positional information on the irradiated areas IA of the light-emitting elements 820. The image processing circuit 79 performs image processing on each of the divided images IM. Detailed operations of the divided image generation circuit 72, the storage circuit 73, and the image processing circuit 79 will be described later with reference to FIG. 10 and subsequent drawings.

The host IC 70 includes a lighting pattern generation circuit 74 and a lighting pattern storage circuit 75 as control circuits for the light source device 80. The lighting pattern storage circuit 75 stores therein information on the lighting pattern of on (lit-up) and off (non-lit) of the light-emitting elements 82 for each period. The lighting pattern generation circuit 74 generates various control signals based on the information on the lighting pattern in the lighting pattern storage circuit 75. The lighting pattern generation circuit 74 outputs the light-emitting element control signal including the information on the lighting pattern of "on" and "off" of the light-emitting elements 82 to the light-emitting element control circuit 12 for each period.

The host IC 70 further includes the image generation circuit 76. The image generation circuit 76 generates an entire image IMA by combining the divided images IM based on the divided images IM acquired from the divided image generation circuit 72 (or divided images IMa after image processing that are generated by the image processing circuit 79) and the information on the lighting pattern of the light-emitting elements 82.

Although not illustrated, the host IC 70 includes a control circuit that synchronously controls the detection control circuit 11 and the light-emitting element control circuit 12. That is, the switching of the lighting pattern of the light-emitting elements 82 of the light source device 80 and the detection using the photodiodes 30 of the optical sensor 10 are synchronously controlled based on a control signal from the host IC 70. The optical sensor 10 includes the two gate line drive circuits 15A and 15B but may include one gate line drive circuit. The light source device 80 includes the two gate line drive circuits 15C and 15D but may include one gate line drive circuit.

Figure 4:
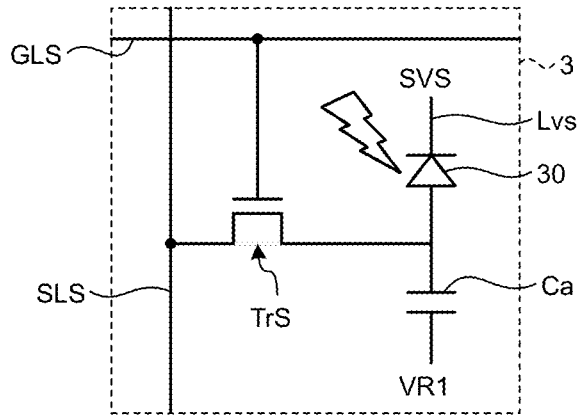
FIG. 4 is a circuit diagram illustrating a sensor pixel.

The following describes a configuration example of the optical sensor 10. FIG. 4 is a circuit diagram illustrating the sensor pixel. As illustrated in FIG. 4, the sensor pixel 3 includes the photodiode 30, a capacitive element Ca, and a first transistor TrS. The first transistor TrS is provided correspondingly to the photodiodes 30. The first transistor TrS is formed of a thin-film transistor, and in this example, formed of an n-channel metal oxide semiconductor (MOS) thin-film transistor (TFT). The gate of the first transistor TrS is coupled to the sensor gate line GLS. The source of the first transistor TrS is coupled to the sensor signal line SLS. The drain of the first transistor TrS is coupled to the anode of the photodiode 30 and the capacitive element Ca.

The cathode of the photodiode 30 is supplied with a power supply potential SVS from the detection control circuit 11. The capacitive element Ca is supplied with a reference potential VR1 serving as an initial potential of the capacitive element Ca from the detection control circuit 11.

When the sensor pixel 3 is irradiated with light, a current corresponding to the amount of the light flows through the photodiode 30. As a result, an electric charge is stored in the capacitive element Ca. After the first transistor TrS is turned on, a current corresponding to the electric charge stored in the capacitive element Ca flows through the sensor signal line SLS. The sensor signal line SLS is coupled to the detection control circuit 11 through the signal line drive circuit 16A. Thus, the optical sensor 10 of the detection device 1 can detect a signal corresponding to the amount of the light received by the photodiode 30 for each of the sensor pixels 3.

The first transistor TrS is not limited to the n-type TFT, and may be configured as a p-type TFT. The pixel circuit of the sensor pixel 3 illustrated in FIG. 4 is merely exemplary. The sensor pixel 3 may be provided with a plurality of transistors corresponding to one photodiode 30.

Figure 5:
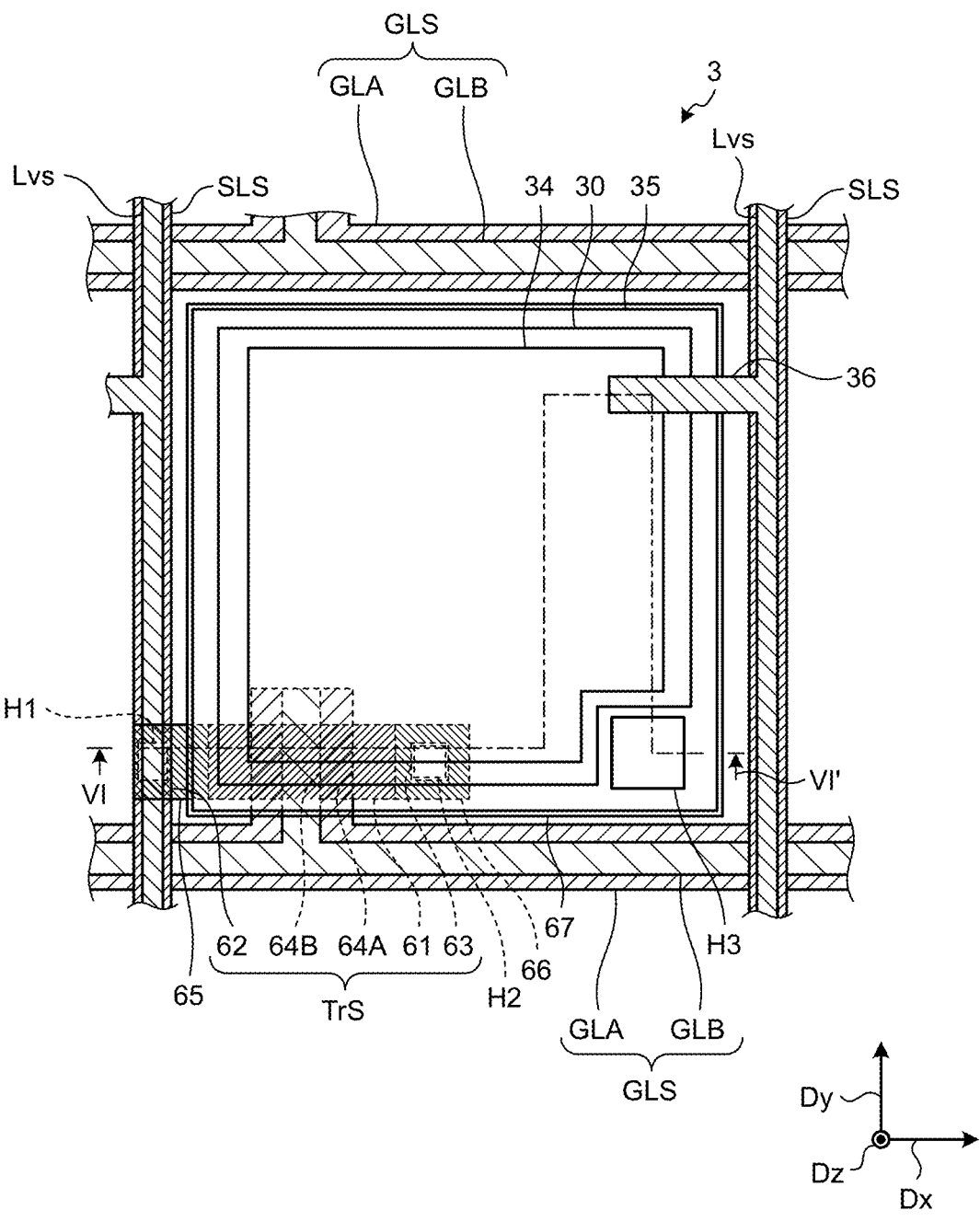
FIG. 5 is a plan view schematically illustrating the sensor pixel according to the first embodiment.

The following describes a detailed configuration of the optical sensor 10. FIG. 5 is a plan view schematically illustrating the sensor pixel according to the first embodiment.

In the following description, a first direction Dx is one direction in a plane parallel to the substrate 21 (refer to FIG. 6). A second direction Dy is one direction in the plane parallel to the substrate 21 and is a direction orthogonal to the first direction Dx. The second direction Dy may nonorthogonally intersect the first direction Dx. A third direction Dz is a direction orthogonal to the first direction Dx and the second direction Dy and is a direction normal to the principle surface of the substrate 21. The term "plan view" refers to a positional relation when viewed in a direction orthogonal to the substrate 21.

As illustrated in FIG. 5, the sensor pixel 3 is an area surrounded by the sensor gate lines GLS and the sensor signal lines SLS. In the present embodiment, the sensor gate line GLS includes a first sensor gate line GLA and a second sensor gate line GLB. The first sensor gate line GLA is provides so as to overlap the second sensor gate line GLB. The first and the second sensor gate lines GLA and GLB are provided in different layers with insulating layers 22c and 22d interposed therebetween (refer to FIG. 6). The first and the second sensor gate lines GLA and GLB are electrically coupled together at any point and are supplied with the gate drive signals having the same potential. At least one of the first sensor gate line GLA and the second sensor gate line GLB is coupled to the gate line drive circuits 15A and 15B. In FIG. 5, the first and the second sensor gate lines GLA and GLB have different widths but may have the same width.

The photodiode 30 is provided in the area surrounded by the sensor gate lines GLS and the sensor signal lines SLS. An upper electrode 34 and a lower electrode 35 are provided for each of the photodiodes 30. The photodiode 30 is a PIN photodiode, for example. The lower electrode 35 is, for example, an anode electrode of the photodiode 30. The upper electrode 34 is, for example, a cathode electrode of the photodiode 30.

The upper electrode 34 is coupled to a power supply signal line Lvs through coupling wiring 36. The power supply signal line Lvs is wiring that supplies the power supply potential SVS to the photodiode 30. In the present embodiment, the power supply signal line Lvs extends in the second direction Dy while overlapping the sensor signal line SLS. The sensor pixels 3 arranged in the second direction Dy are coupled to the power supply signal line Lvs that is shared by those sensor pixels 3. Such a configuration can enlarge an opening for the sensor pixel 3. The lower electrode 35, the photodiode 30, and the upper electrode 34 are substantially quadrilateral in plan view. However, the shapes of the lower electrode 35, the photodiode 30, and the upper electrode 34 are not limited thereto and can be changed as appropriate.

The first transistor TrS is provided near an intersection between the sensor gate line GLS and the sensor signal line SLS. The first transistor TrS includes a semiconductor layer 61, a source electrode 62, a drain electrode 63, a first gate electrode 64A, and a second gate electrode 64B.

The semiconductor layer 61 is an oxide semiconductor. The semiconductor layer 61 is more preferably a transparent amorphous oxide semiconductor (TAOS) as one of the oxide semiconductors. Using an oxide semiconductor as the first transistor TrS can reduce a leakage current of the first transistor TrS. That is, the first transistor TrS can reduce the leakage current from a non-selected one of the sensor pixels 3. Therefore, the optical sensor 10 can improve the signal-to-noise (S/N) ratio. The semiconductor layer 61 is, however, not limited thereto, and may be formed of, for example, a microcrystalline oxide semiconductor, an amorphous oxide semiconductor, polysilicon, or low-temperature polycrystalline silicon (LTPS).

The semiconductor layer 61 is provided along the first direction Dx and intersects the first and the second gate electrodes 64A and 64B in plan view. The first and the second gate electrodes 64A and 64B are provided so as to branch from the first and the second sensor gate lines GLA and GLB, respectively. In other words, portions of the first and the second sensor gate lines GLA and GLB that overlap the semiconductor layer 61 serve as the first and the second gate electrodes 64A and 64B. Aluminum (Al), copper (Cu), silver (Ag), molybdenum (Mo), or an alloy of these metals is used as the first and the second gate electrodes 64A and 64B. A channel region is formed in a portion of the semiconductor layer 61 that overlaps the first and the second gate electrodes 64A and 64B.

One end of the semiconductor layer 61 is coupled to the source electrode 62 through a contact hole H1. The other end of the semiconductor layer 61 is coupled to the drain electrode 63 through a contact hole H2. A portion of the sensor signal line SLS that overlaps the semiconductor layer 61 serves as the source electrode 62. A portion of a third conductive layer 67 that overlaps the semiconductor layer 61 serves as the drain electrode 63. The third conductive layer 67 is coupled to the lower electrode 35 through a contact hole H3. Such a configuration allows the first transistor TrS to switch between coupling and decoupling between the photodiode 30 and the sensor signal line SLS.

The following describes a layer configuration of the optical sensor 10. FIG. 6 is a sectional view along VI-VI' of FIG. 5.

In the description of the detection device 1 that includes the optical sensor 10, a direction from the substrate 21 toward the photodiode 30 in a direction (third direction Dz) orthogonal to a surface of the substrate 21 is referred to as "upward" or "above". A direction from the photodiode 30 toward the substrate 21 is referred to as "downward" or "below".

Figure 6:
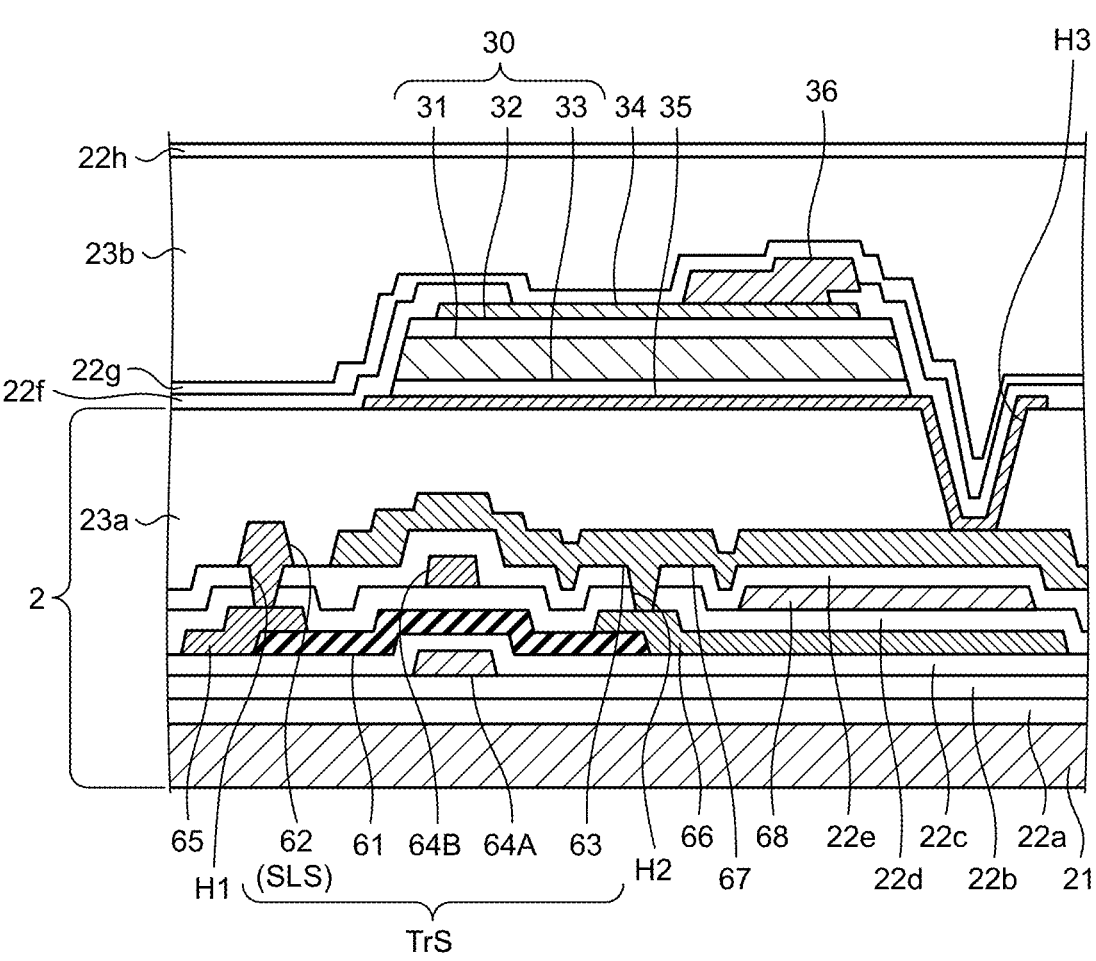
FIG. 6 is a sectional view along VI-VI' of FIG. 5.

As illustrated in FIG. 6, the substrate 21 is an insulating substrate and is made using, for example, a glass substrate of quartz, alkali-free glass, or the like. The first transistor TrS, various types of wiring (the sensor gate line GLS and the sensor signal line SLS), and insulating layers are provided to form the array substrate 2 on one surface side of the substrate 21. The photodiodes 30 are arranged on the upper side of the array substrate 2, that is, on the one surface side of the substrate 21. The substrate 21 may be a resin substrate or a resin film made of a resin such as polyimide.

Insulating layers 22a and 22b are provided on the substrate 21. Insulating layers 22a, 22b, 22c, 22d, 22e, 22f, and 22g are inorganic insulating films and are formed of a silicon oxide ($SiO_2$) or a silicon nitride (SiN). Each of the inorganic insulating layers is not limited to a single layer and may be a multilayered film.

The first gate electrode 64A is provided above the insulating layer 22b. The insulating layer 22c is provided on the insulating layer 22b so as to cover the first gate electrode 64A. The semiconductor layer 61, a first conductive layer 65, and a second conductive layer 66 are provided on the insulating layer 22c. The first conductive layer 65 is provided so as to cover an end of the semiconductor layer 61 coupled to the source electrode 62. The second conductive layer 66 is provided so as to cover an end of the semiconductor layer 61 coupled to the drain electrode 63.

The insulating layer 22d is provided on the insulating layer 22c so as to cover the semiconductor layer 61, the first conductive layer 65, and the second conductive layer 66. The second gate electrode 64B is provided on the insulating layer 22d. The semiconductor layer 61 is provided between the first gate electrode 64A and the second gate electrode 64B in the direction orthogonal to the substrate 21. That is, the first transistor TrS has what is called a dual-gate structure. The first transistor TrS may, however, have a bottom-gate structure that is provided with the first gate electrode 64A and not provided with the second gate electrode 64B, or a top-gate structure that is not provided with the first gate electrode 64A and provided with only the second gate electrode 64B.

The insulating layer 22e is provided on the insulating layer 22d so as to cover the second gate electrode 64B. The source electrode 62 (sensor signal line SLS) and the drain electrode 63 (third conductive layer 67) are provided on the insulating layer 22e. In the present embodiment, the drain electrode 63 is the third conductive layer 67 provided above the semiconductor layer 61 with the insulating layers 22d and 22e interposed therebetween. The source electrode 62 is electrically coupled to the semiconductor layer 61 through the contact hole H1 and the first conductive layer 65. The drain electrode 63 is electrically coupled to the semiconductor layer 61 through the contact hole H2 and the second conductive layer 66.

The third conductive layer 67 is provided in an area overlapping the photodiode 30 in plan view. The third conductive layer 67 is provided also on the upper side of the semiconductor layer 61 and the first and the second gate electrodes 64A and 64B. That is, the third conductive layer 67 is provided between the second gate electrode 64B and the lower electrode 35 in the direction orthogonal to the substrate 21. With this configuration, the third conductive layer 67 has a function as a protective layer that protects the first transistor TrS.

The second conductive layer 66 extends so as to face the third conductive layer 67 in an area not overlapping the semiconductor layer 61. A fourth conductive layer 68 is provided on the insulating layer 22d in the area not overlapping the semiconductor layer 61. The fourth conductive layer 68 is provided between the second conductive layer 66 and the third conductive layer 67. This configuration generates capacitance between the second conductive layer 66 and the fourth conductive layer 68, and capacitance between the third conductive layer 67 and the fourth conductive layer 68. The capacitance generated by the second conductive layer 66, the third conductive layer 67, and the fourth conductive layer 68 serves as capacitance of the capacitive element Ca illustrated in FIG. 4.

A first organic insulating layer 23a is provided on the insulating layer 22e so as to cover the source electrode 62 (sensor signal line SLS) and the drain electrode 63 (third conductive layer 67). The first organic insulating layer 23a is a planarizing layer that planarizes asperities formed by the first transistor TrS and various conductive layers.

The following describes a sectional configuration of the photodiode 30. The photodiode 30 is stacked on the first organic insulating layer 23a of the array substrate 2 in the order of the lower electrode 35, the photodiode 30, and the upper electrode 34.

The lower electrode 35 is provided on the first organic insulating layer 23a and is electrically coupled to the third conductive layer 67 through the contact hole H3. The lower electrode 35 is the anode of the photodiode 30 and is an electrode for reading the detection signal Vdet. For example, a metal material such as molybdenum (Mo) or aluminum (Al) is used as the lower electrode 35. The lower electrode 35 may alternatively be a multilayered film formed of a plurality of layers of these metal materials. The lower electrode 35 may be formed of a light-transmitting conductive material such as indium tin oxide (ITO) or indium zinc oxide (IZO).

The photodiode 30 includes an i-type semiconductor layer 31, an n-type semiconductor layer 32, and a p-type semiconductor layer 33 as semiconductor layers. The i-type semiconductor layer 31, the n-type semiconductor layer 32, and the p-type semiconductor layer 33 are formed of amorphous silicon (a-Si), for example. In FIG. 6, the p-type semiconductor layer 33, the i-type semiconductor layer 31, and the n-type semiconductor layer 32 are stacked in this order in the direction orthogonal to the surface of the substrate 21. However, the photodiode 30 may have a reversed configuration. That is, the n-type semiconductor layer 32, the i-type semiconductor layer 31, and the p-type semiconductor layer 33 may be stacked in this order. Each of the semiconductor layers may be a photoelectric conversion element formed of an organic semiconductor.

The a-Si of the n-type semiconductor layer 32 is doped with impurities to form an n+ region. The a-Si of the p-type semiconductor layer 33 is doped with impurities to form a p+ region. The i-type semiconductor layer 31 is, for example, a non-doped intrinsic semiconductor and has lower conductivity than that of the n-type semiconductor layer 32 and the p-type semiconductor layer 33.

The upper electrode 34 is the cathode of the photodiode 30 and is an electrode for supplying the power supply potential SVS to the photoelectric conversion layers. The upper electrode 34 is, for example, a light-transmitting conductive layer of, for example, ITO, and a plurality of the upper electrodes 34 are provided for the respective photodiodes 30.

The insulating layers 22f and 22g are provided on the first organic insulating layer 23a. The insulating layer 22f covers the periphery of the upper electrode 34 and is provided with an opening in a position overlapping the upper electrode 34. The coupling wiring 36 is coupled to a portion of the upper electrode 34 not provided with the insulating layer 22*f*. The insulating layer 22*g* is provided on the insulating layer 22*f* so as to cover the upper electrode 34 and the coupling wiring 36. A second organic insulating layer 23*b* serving as a planarizing layer is provided on the insulating layer 22*g*. If the photodiode 30 is made of organic semiconductors, an insulating layer 22*h* may be further provided on the upper side thereof.

Figure 7:
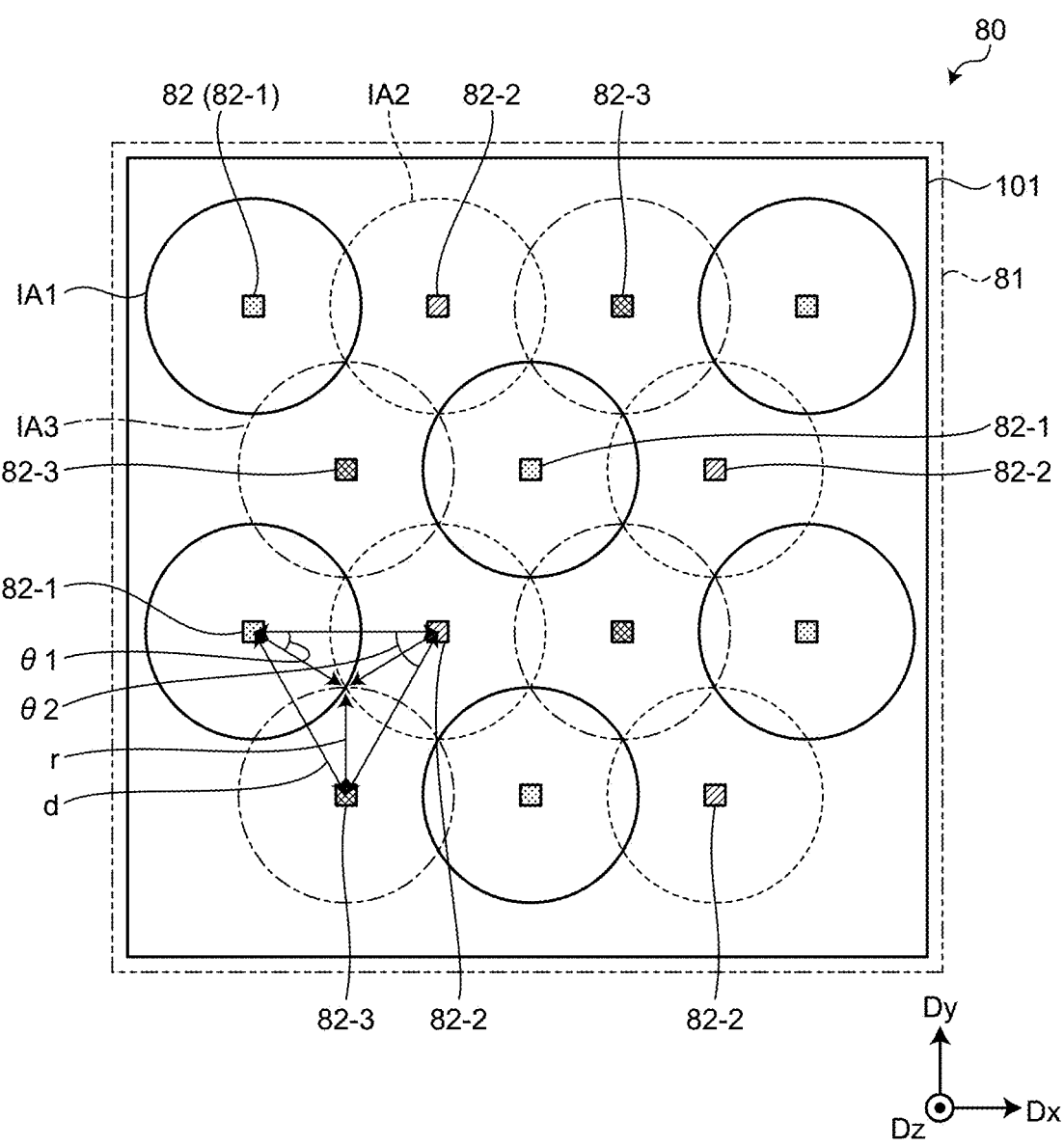
FIG. 7 is an explanatory view for schematically explaining a relation of a plurality of light-emitting elements with irradiated areas.

The following describes one example of the detection method of the detection device 1 according to the present embodiment. FIG. 7 is an explanatory view for schematically explaining a relation of the light-emitting elements with the irradiated areas.

As illustrated in FIG. 7, the light-emitting elements 82 include a plurality of light-emitting elements 82-1 (first light sources), a plurality of light-emitting elements 82-2 (second light sources), and a plurality of light-emitting elements 82-3 (third light sources). The light-emitting elements 82-1, 82-2, and 82-3 are separately arranged in a staggering manner (in a delta pattern). Among three of the light-emitting elements 82 illustrated in FIG. 8, the light-emitting elements 82-1 and 82-2 are arranged adjacent to each other in the first direction Dx. A light-emitting element 82-3 is arranged diagonally adjacent to the light-emitting elements 82-1 and 82-2.

The light-emitting elements 82-1, 82-2, and 82-3 are distinguished and illustrated as a group of the light-emitting elements 82 that are switched between the lit-up state (on) and the non-lit state (off) for each period. The light-emitting elements 82-1, 82-2, and 82-3 have the same configuration and emit the light L having the same wavelength. In other words, the light-emitting elements 82-1, 82-2, and 82-3 are distinguished according to the lighting pattern.

The adjacent light-emitting elements 82-1, 82-2, and 82-3 are arranged so as to form an equilateral triangle. The light-emitting elements 82-1, 82-2, and 82-3 are repeatedly arranged in this order in the first direction Dx. The light-emitting elements 82 in the first row and the light-emitting elements 82 in the second row are arranged in positions shifted in the first direction Dx. Arrangement pitches d of the light-emitting elements 82 are all equal. An arrangement pitch d of the light-emitting elements 82-1 and 82-2 adjacent in the first direction Dx is equal to the arrangement pitch d of the light-emitting elements 82-1 and 82-3 adjacent in the diagonal direction, and equal to the arrangement pitch d of the light-emitting elements 82-2 and 82-3 adjacent in the diagonal direction. The arrangement pitch of two of the light-emitting elements 82-1 that are lit up during the same period is larger than the arrangement pitch d described above. The arrangement pitch d is a distance between the centroids of the adjacent light-emitting elements 82.

An angle θ1 is 30 degrees between an imaginary line connecting the centroid of the triangle formed by the light-emitting elements 82-1, 82-2, and 82-3 to any one of the light-emitting elements 82 and an imaginary line connecting the one of the light-emitting elements 82 to another light-emitting element 82 adjacent thereto. An angle θ2 between an imaginary line connecting a pair of adjacent light-emitting elements 82 and another imaginary line connecting another pair of adjacent light-emitting elements 82 (interior angle of the triangle formed by the light-emitting elements 82-1, 82-2, and 82-3) is 60 degrees. Specifically, the angle θ1 is 30 degrees between an imaginary line connecting the centroid of the triangle formed by the light-emitting elements 82-1, 82-2, and 82-3 to the light-emitting element 82-1 and an imaginary line connecting together the light-emitting elements 82-1 and 82-2 adjacent in the first direction Dx. The angle θ2 is 60 degrees between the imaginary line connecting together the light-emitting elements 82-1 and 82-2 adjacent in the first direction Dx and an imaginary line connecting together the light-emitting elements 82-2 and 82-3 adjacent in the diagonal direction.

Figure 8:
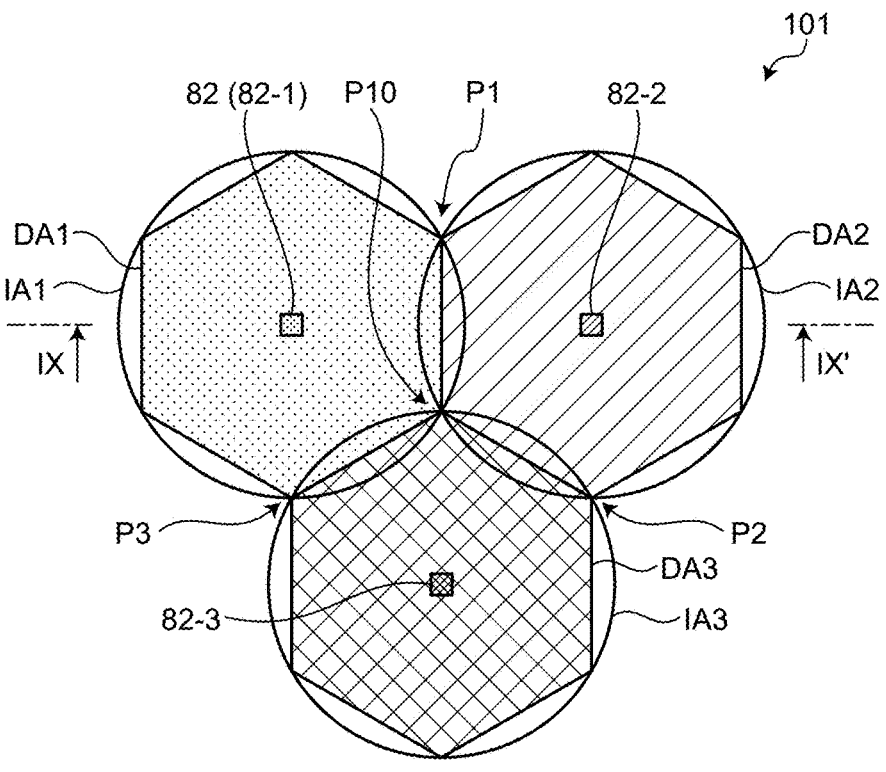
FIG. 8 is an explanatory view for schematically explaining a relation of the irradiated areas of the light-emitting elements with assigned areas.
Figure 9:
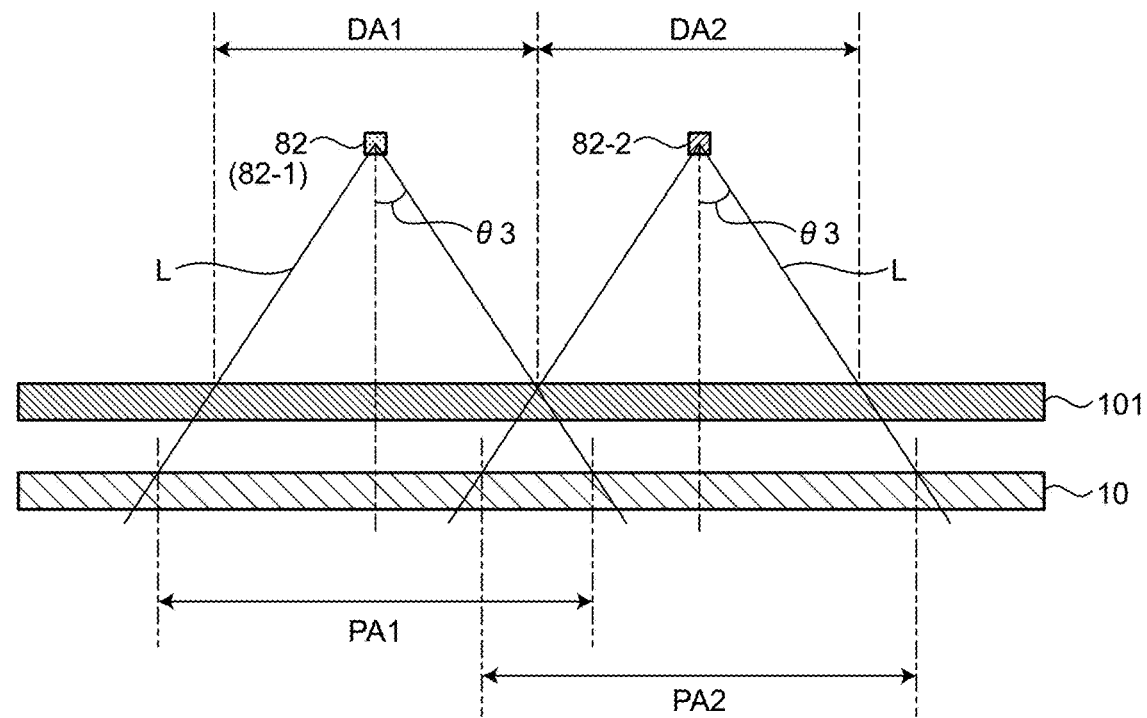
FIG. 9 is a sectional view along IX-IX' of FIG. 8.

FIG. 8 is an explanatory view for schematically explaining a relation of the irradiated areas of the light-emitting elements with assigned areas. FIG. 9 is a sectional view along IX-IX' of FIG. 8. As illustrated in FIGS. 8 and 9, areas on the placement substrate 101 irradiated with light Li from the light-emitting elements 82-1, 82-2, and 82-3 are referred to as irradiated areas IA1, IA2, and IA3, respectively.

As illustrated in FIG. 8, the irradiated areas IA1, IA2, and IA3 are arranged so as to cover the entire surface of the placement substrate 101 and have portions that overlap one another. For example, the outer perimeter of the irradiated area IA1 intersects the outer perimeter of the irradiated area IA2 at intersection points P1 and P10. The outer perimeter of the irradiated area IA2 intersects the outer perimeter of the irradiated area IA3 at intersection points P2 and P10. The outer perimeter of the irradiated area IA1 intersects the outer perimeter of the irradiated area IA3 at intersection points P3 and P10. An irradiation radius r of the irradiated areas IA1, IA2, and IA3 (refer to FIG. 7) and the arrangement pitch d of the light-emitting elements 82 (refer to FIG. 7) satisfy Expression (1) below. The irradiation radius r is the length of an imaginary line connecting the center of any one of the irradiated areas IA1, IA2, and IA3 to any point on the outer perimeter thereof. The centers of the irradiated areas IA1, IA2, and IA3 coincide with the respective centroids of the light-emitting elements 82-1, 82-2, and 82-3.

$$d \leq 2 \times r \times \cos(30°) = \sqrt{3} \times r \qquad (1)$$

The arrangement pitch d of the light-emitting elements 82 is, for example, 1 mm to 20 mm. The distance between the light-emitting element 82 and the optical sensor 10 (photodiode 30) is 4 mm to 80 mm in the direction orthogonal to the surface of the optical sensor 10.

With this configuration, the light-emitting elements 82 are arranged such that the irradiated areas IA1, IA2, and IA3 cover the entire placement substrate 101. The distance between the light-emitting element 82 and the optical sensor 10 (photodiode 30) can be smaller than that when one light-emitting element 82 is configured so as to irradiate the entire placement substrate 101, allowing the entire detection device 1 to be downsized.

In the following description, areas that correspond to the respective irradiated areas IA1, IA2, and IA3 and are set by being divided for the respective light-emitting elements 82 so as not to form overlapping portions, are referred to as assigned areas DA1, DA2, and DA3. Each of the assigned areas DA1, DA2, and DA3 is hexagonal. The assigned areas DA1 and DA2 adjacent in the first direction Dx are separated by a straight line connecting together the intersection points P1 and P10. In the same way, the diagonally adjacent assigned areas DA2 and DA3 are separated by a straight line connecting together the intersection points P2 and P10. The diagonally adjacent assigned areas DA1 and DA3 are separated by a straight line connecting together the intersection points P3 and P10.

As illustrated in FIG. 9, the light L emitted from the light-emitting elements 82 spreads at an irradiation angle θ3 and travels to the optical sensor 10. The optical sensor 10 is located on the lower side of the placement substrate 101 with a predetermined gap interposed therebetween. Therefore, the area where the light L transmitted through the assigned areas DA1 and DA2 is projected onto the optical sensor 10 (hereinafter, referred to as projected areas PA1 and PA2) has a larger area than the assigned areas DA1 and DA2. In the optical sensor 10, the adjacent projected areas PA1 and PA2 have an overlapping portion.

Although not illustrated in FIG. 9, the area where the light L transmitted through the assigned area DA3 is projected onto the optical sensor 10 (hereinafter, referred to as a projected area PA3) also has a larger area than the assigned area DA3. That is, the adjacent projected areas PA2 and PA3 have an overlapping portion, and the adjacent projected areas PA1 and PA3 have an overlapping portion. As a result, if the adjacent light-emitting elements 82-1, 82-2, and 82-3 are simultaneously lit up to detect the optical sensor 10, the image may be blurred in the overlapping portions of the projected areas PA1, PA2, and PA3.

The following describes the detection method of the detection device 1.

Figure 10:
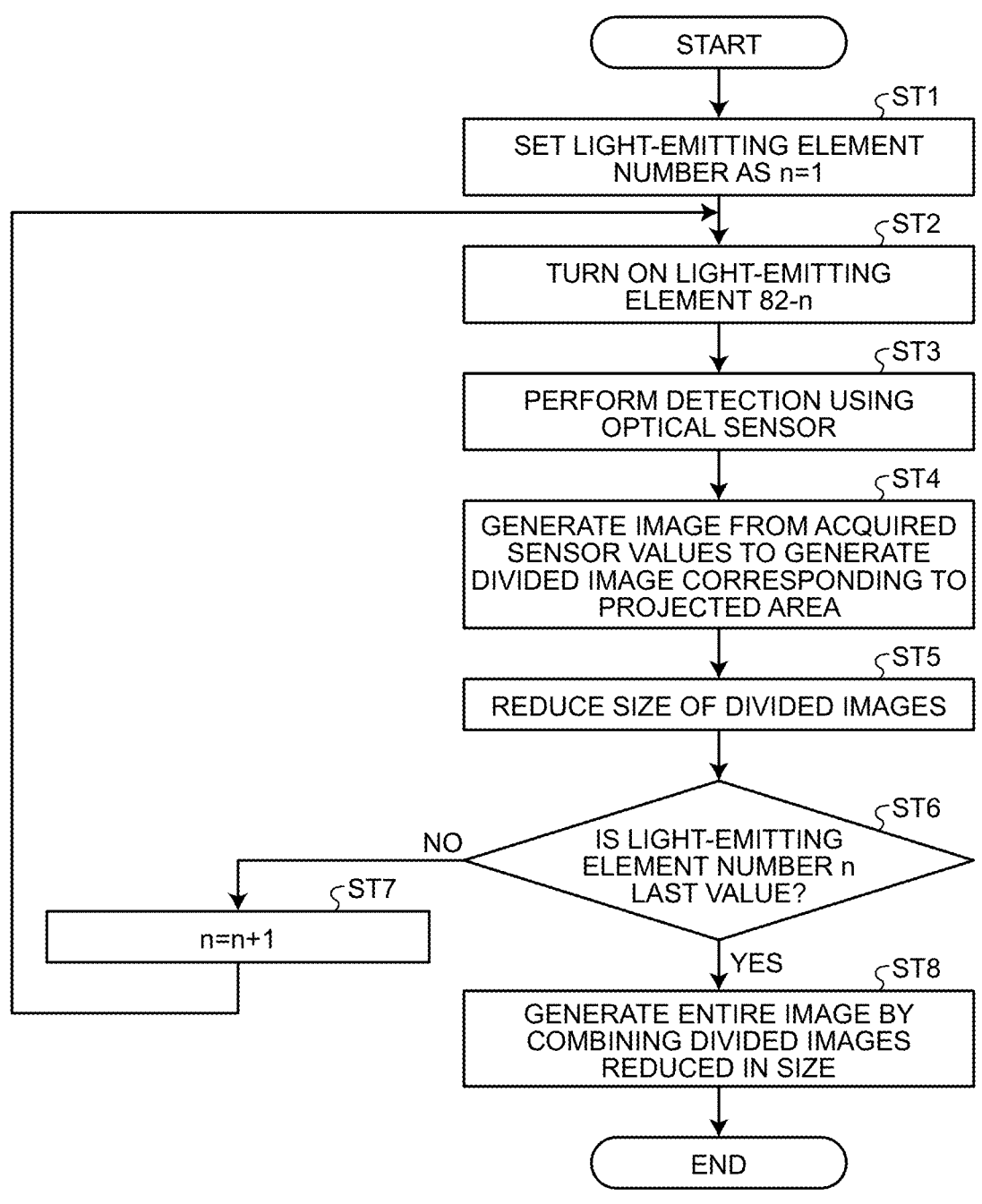
FIG. 10 is a flowchart illustrating a detection method of the detection device according to the first embodiment.

FIG. 10 is a flowchart illustrating the detection method of the detection device according to the first embodiment. As illustrated in FIG. 10, the host IC 70 (refer to FIG. 2) sets a light-emitting element number n as n=1 (Step ST1). In the present embodiment, the light-emitting element number n is a natural number of 1 to 3 and is assigned correspondingly to each of the light-emitting elements 82-1, 82-2, and 82-3. In the present embodiment, the last value of the light-emitting element number n is given as n=3. The "light-emitting element number" may be referred to as, for example, a "light-emitting element group number" common to the light-emitting elements 82 that do not overlap one another when being lit-up.

The light source device 80 (refer to FIG. 2) turns on the light-emitting elements 82-1 corresponding to the light-emitting element number n=1 during a period corresponding to the light-emitting element number n=1 (first period), based on the control signal from the lighting pattern generation circuit 74 (Step ST2). The light source device 80 turns off the light-emitting elements 82-2 and 82-3 other than the light-emitting elements 82-1.

Then, the host IC 70 (refer to FIG. 2) performs the detection using the optical sensor 10 (Step ST3). The optical sensor 10 scans the photodiodes 30 in the entire detection area AA. Specifically, the gate line drive circuits 15A and 15B of the optical sensor 10 sequentially scan from the sensor gate line GLS in the first row to the sensor gate line GLS in the last row. As a result, the sensor values So are transmitted to the host IC 70 from the photodiodes 30 in the entire detection area AA.

The light-emitting elements 82-2 and 82-3 adjacent to the lit-up light-emitting elements 82-1 are turned off during the period corresponding to the light-emitting element number n=1. As a result, in the optical sensor 10, the light L transmitted through the assigned area DA1 is applied onto the projected area PA1 (refer to FIG. 9), and the light L is not applied onto the assigned areas DA2 and DA3 (projected areas PA2 and PA3). In the detection using the optical sensor 10 at Step ST3, the sensor values So are output from the photodiodes 30 on the entire surface including the projected area PA1 irradiated with the light L, and the projected areas PA2 and PA3 not irradiated with the light L.

The divided image generation circuit 72 (refer to FIG. 2) generates an image from the sensor values So acquired from the photodiodes 30 to generate a divided image IM1 corresponding to the projected area PA1 (Step ST4).

Figure 11:
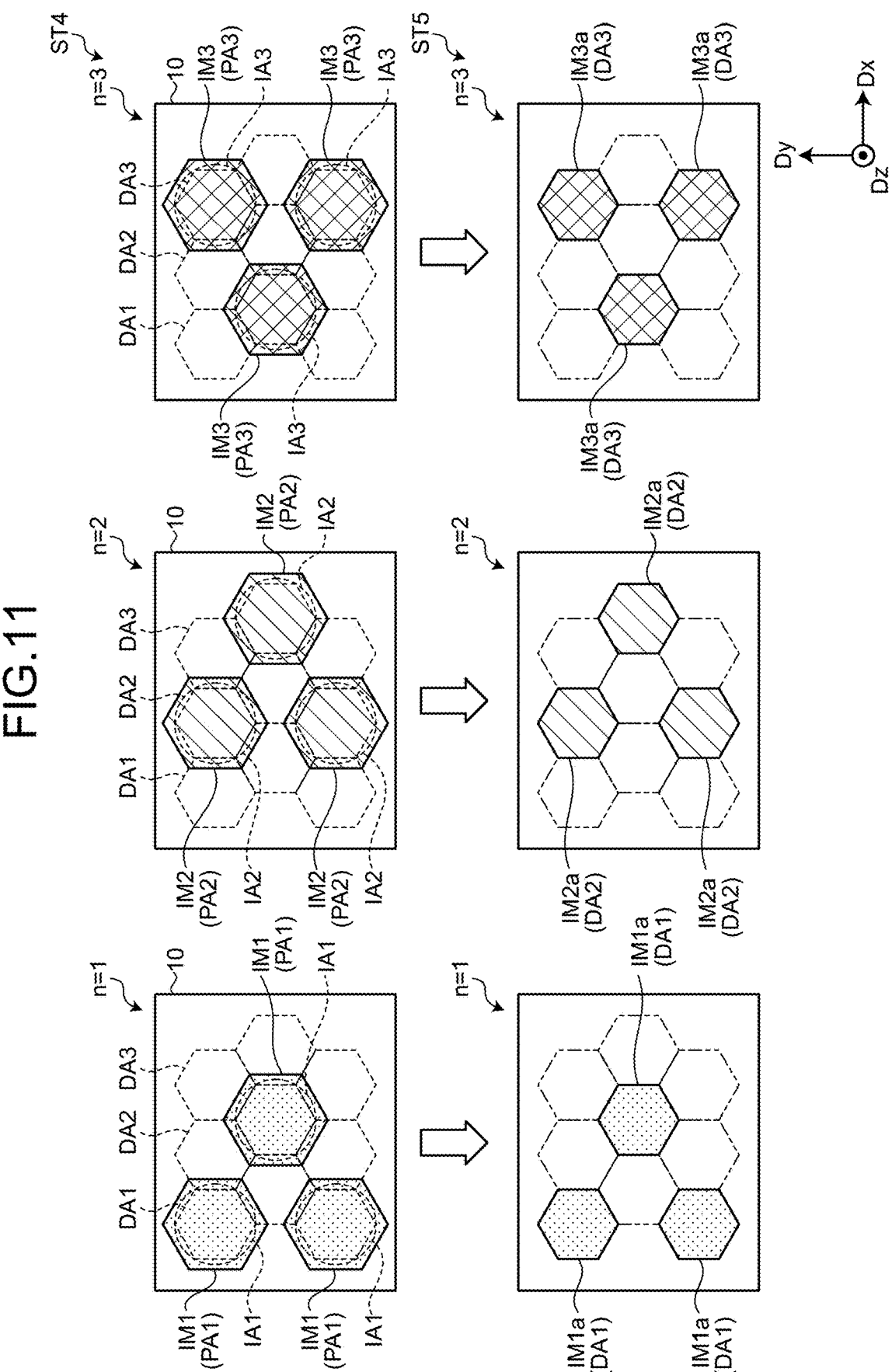
FIG. 11 illustrates explanatory views for explaining generation of divided images and reduction in size of the divided images at Steps ST4 and ST5.

FIG. 11 illustrates explanatory views for explaining the generation of the divided images and reduction in size of the divided images at Steps ST4 and ST5. In the views of FIG. 11, divided images IM1, IM2, and IM3 and divided images IM1a, IM2a, and IM3a after the image processing out of the entire image are indicated with hatching. The left views of FIG. 11 illustrate the generation of the divided images and the reduction in size of the divided images for the light-emitting element number n=1. The center views of FIG. 11 illustrate the generation of the divided images and the reduction in size of the divided images for the light-emitting element number n=2. The right views of FIG. 11 illustrate the generation of the divided images and the reduction in size of the divided images for the light-emitting element number n=3.

As illustrated in one of the left views of FIG. 11, the divided image generation circuit 72 (refer to FIG. 2) generates the divided image IM1 by cutting out a hexagonal portion corresponding to the irradiated area IA1 irradiated by the lit-up light-emitting element 82-1 (that is, a portion corresponding to the projected area PA1 of the optical sensor 10) from the image based on the sensor values So obtained by scanning the photodiodes 30 in the entire area. In other words, the divided image generation circuit 72 generates the divided images IM1 by cutting off portions of the image corresponding to the overlapping portions of the irradiated areas IA irradiated by the adjacent light-emitting elements 82 (that is, by cutting off portions between the outer perimeters of the assigned areas DA and the outer perimeters of the irradiated areas IA illustrated in FIG. 8). The divided images IM1 are generated correspondingly to the light-emitting elements 82-1 and stored in the storage circuit 73 together with information on position coordinates of the light-emitting elements 82-1 (irradiated areas IA1).

Referring back to FIG. 10, the image processing circuit 79 (refer to FIG. 2) reduces the size of the divided images IM1 (Step ST5). The image processing circuit 79 reduces the size of each of the divided images IM1 according to the distance between the light-emitting elements 82 and the optical sensor 10 and the distance between the light-emitting elements 82 and the placement substrate 101 in the direction orthogonal to the surface of the optical sensor 10.

As illustrated in the left views of FIG. 11, the divided image IM1a after the image processing has substantially the same shape and area as those of the assigned area DA1 set correspondingly to the irradiated area IA1 irradiated by the light-emitting element 82-1. When h1 denotes the distance between each of the light-emitting elements 82 and the placement substrate 101 and h2 denotes the distance between each of the light-emitting elements 82 and the optical sensor 10, the size reduction ratio of the divided image IM1 is set as $h1/h2 \times 100(\%)$. The reason for reducing the size is that the image captured by the optical sensor 10 is made larger than the actual object to be detected 100 according to the distance and spread of the light from the light-emitting element 82.

Referring back to FIG. 10, the host IC 70 (refer to FIG. 2) determines whether the light-emitting element number n is the last value (n=3) (Step ST6). If the light-emitting element number n is not the last value (n=3) (No at Step ST6), the host IC 70 increases the light-emitting element number n to n+1 (Step ST7).

The host IC 70 repeats Steps ST2 to ST5 described above for each of the light-emitting element numbers n=2 and n=3. Specifically, during a period corresponding to the light-emitting element number n=2 (second period), the light source device 80 (refer to FIG. 2) turns on the light-emitting element 82-2 corresponding to the light-emitting element number n=2 and turns off the light-emitting elements 82-1 and 82-3 other than the light-emitting element 82-2. The optical sensor 10 scans the photodiodes 30 in the entire detection area AA.

As illustrated in one of the center views of FIG. 11, the divided image generation circuit 72 (refer to FIG. 2) generates the divided image IM2 by cutting out a hexagonal portion corresponding to the irradiated area IA2 irradiated by the lit-up light-emitting element 82-2 (that is, by cutting out a portion corresponding to the projected area PA2 of the optical sensor 10) from the image based on the sensor values So. The divided images IM2 are generated correspondingly to the light-emitting elements 82-2 and stored in the storage circuit 73 together with information on position coordinates of the light-emitting elements 82-2 (irradiated areas IA2).

The image processing circuit 79 (refer to FIG. 2) also reduces the size of the divided images IM2. As illustrated in the center views of FIG. 11, the divided image IM2a after the image processing has substantially the same shape and area as those of the assigned area DA2 set correspondingly to the irradiated area IA2 irradiated by the light-emitting element 82-2.

During a period corresponding to the light-emitting element number n=3 (third period), the light source device 80 (refer to FIG. 2) turns on the light-emitting element 82-3 corresponding to the light-emitting element number n=3 and turns off the light-emitting elements 82-1 and 82-2 other than the light-emitting element 82-3. The optical sensor 10 scans the photodiodes 30 in the entire detection area AA.

As illustrated in one of the right views of FIG. 11, the divided image generation circuit 72 (refer to FIG. 2) generates the divided image IM3 by cutting out a hexagonal portion corresponding to the irradiated area IA3 irradiated by the lit-up light-emitting element 82-3 (that is, by cutting out a portion corresponding to the projected area PA3 of the optical sensor 10) from the image based on the sensor values So. The divided images IM3 are generated correspondingly to the light-emitting elements 82-3 and stored in the storage circuit 73 together with information on position coordinates of the light-emitting elements 82-3 (irradiated areas IA3).

The image processing circuit 79 (refer to FIG. 2) also reduces the size of the divided images IM3. As illustrated in one of the right views of FIG. 11, the divided image IM3a after the image processing has substantially the same shape and area as those of the assigned area DA3 set correspondingly to the irradiated area IA3 irradiated by the light-emitting element 82-3.

Referring back to FIG. 10, if the light-emitting element number n is the last value (n=3) (Yes at Step ST6), the image generation circuit 76 (refer to FIG. 2) generates the entire image IMA by combining together the divided images IM1a, IM2a, and IM3a after the image processing that have been reduced in size (Step ST8).

Figure 12:
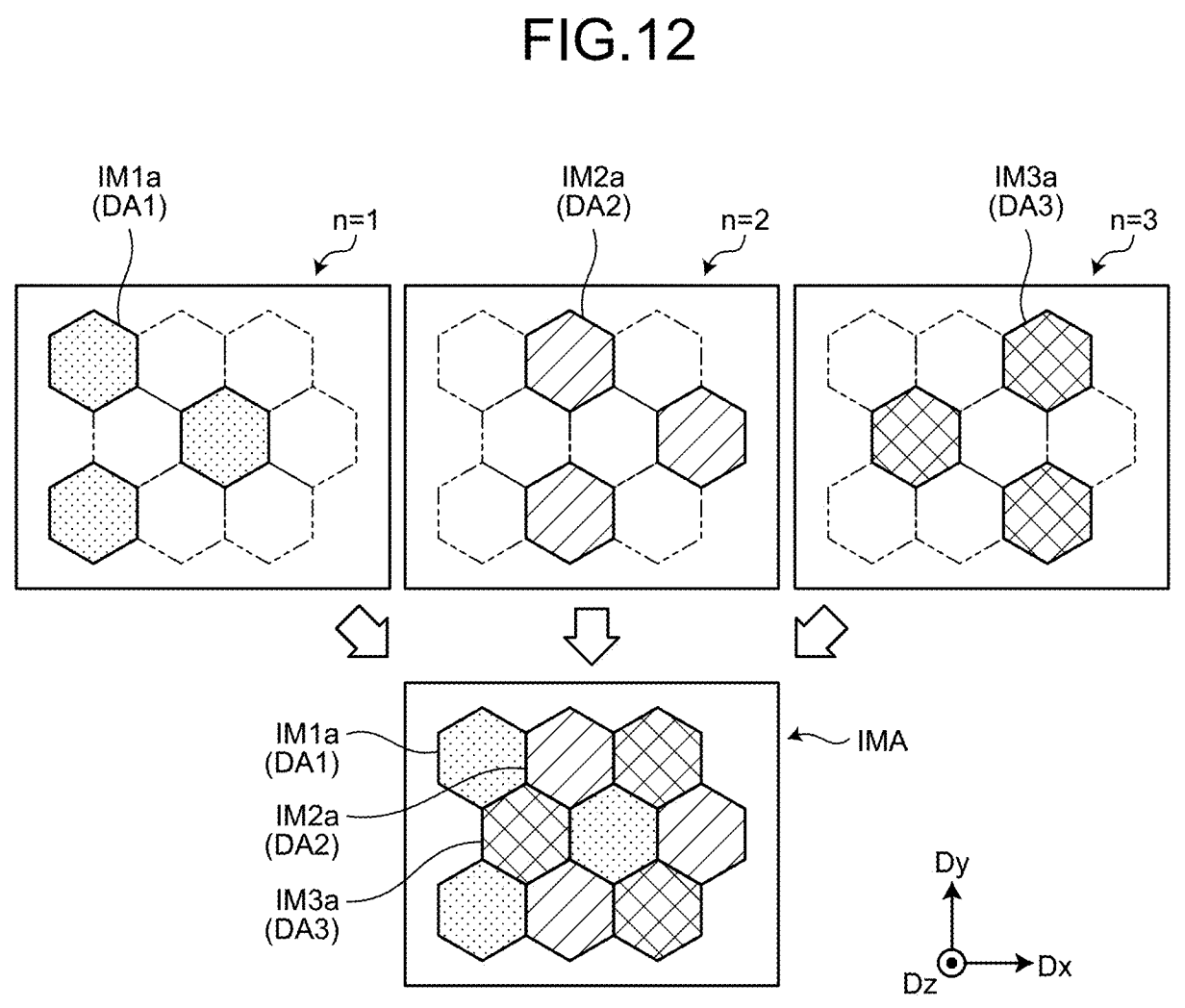

FIG. 12 illustrates explanatory views for explaining a method for generating the entire image by combining the divided images. As illustrated in FIG. 12, the divided images IM1a, IM2a, and IM3a after the image processing that have been acquired in the periods corresponding to the light-emitting element numbers n=1, n=2, and n=3 are reduced in size so as to have the same shape and area as those of the assigned areas DA1, DA2, and DA3, respectively.

That is, the divided images IM1a, IM2a, and IM3a after the image processing have no overlapping portions when they are superimposed. The image generation circuit 76 generates the entire image IMA by combining together the divided images IM1a, IM2a, and IM3a after the image processing such that the sides thereof are in contact with one another.

As described above, in the detection device 1 of the present embodiment, the light-emitting elements 82 include the light-emitting elements 82-1 (first light sources), the light-emitting elements 82-2 (second light sources) and the light-emitting elements 82-3 (third light sources). The light-emitting elements 82-2 are arranged adjacent to the respective light-emitting elements 82-1, and the light-emitting elements 82-3 are arranged adjacent to the light-emitting elements 82-1 and 82-2. The detection device 1 has the first period, the second period, and the third period. The first period is a period in which the light-emitting elements 82-1 are on and the light-emitting elements 82-2 and 82-3 are off. The second period is a period in which the light-emitting elements 82-2 are on and the light-emitting elements 82-1 and 82-3 are off. The third period is a period in which the light-emitting elements 82-3 are on and the light-emitting elements 82-1 and 82-2 are off. The divided images IM1 (first image), the divided images IM2 (second image), and the divided images IM3 are combined together. The divided images IM1 are images detected by the optical sensor 10 in the first period. The divided images IM2 are images detected by the optical sensor 10 in the second period. The divided images IM3 are images detected by the optical sensor 10 in the third period.

Thus, the light-emitting elements 82-1, 82-2, and 82-3 are turned on in a time-division manner, and the optical sensor 10 performs the detection during each of the periods. Then, the divided images IM acquired in the respective periods are combined together to generate the entire image IMA. As a result, compared with a configuration provided with one light-emitting element 82, the distance between the light-emitting element 82 and the optical sensor 10 (photodiode 30) can be made smaller, and unblurred images can be obtained.

The detection method illustrated in FIGS. 10 to 12 is only exemplary and can be changed as appropriate. For example, in FIG. 10, after turning on the light-emitting elements 82-1, 82-2, and 82-3 and performing the detection using the optical sensor 10 in the periods (the light-emitting element numbers n=1, n=2, and n=3), the generation of the divided images IM1, IM2, and IM3 and the image processing (size reduction) at Steps ST4 and ST5 may be performed collectively. The lighting pattern of the light-emitting elements 82 only needs to include at least two light-emitting elements 82-1 and 82-2. In this case, n=2 is the last value for the light-emitting element number n. The entire image IMA may then be generated by combining the divided images IM1 (first image) detected by the optical sensor 10 in the first period with the divided images IM2 (second image) detected by the optical sensor 10 in the second period.

Modification

Figure 13:
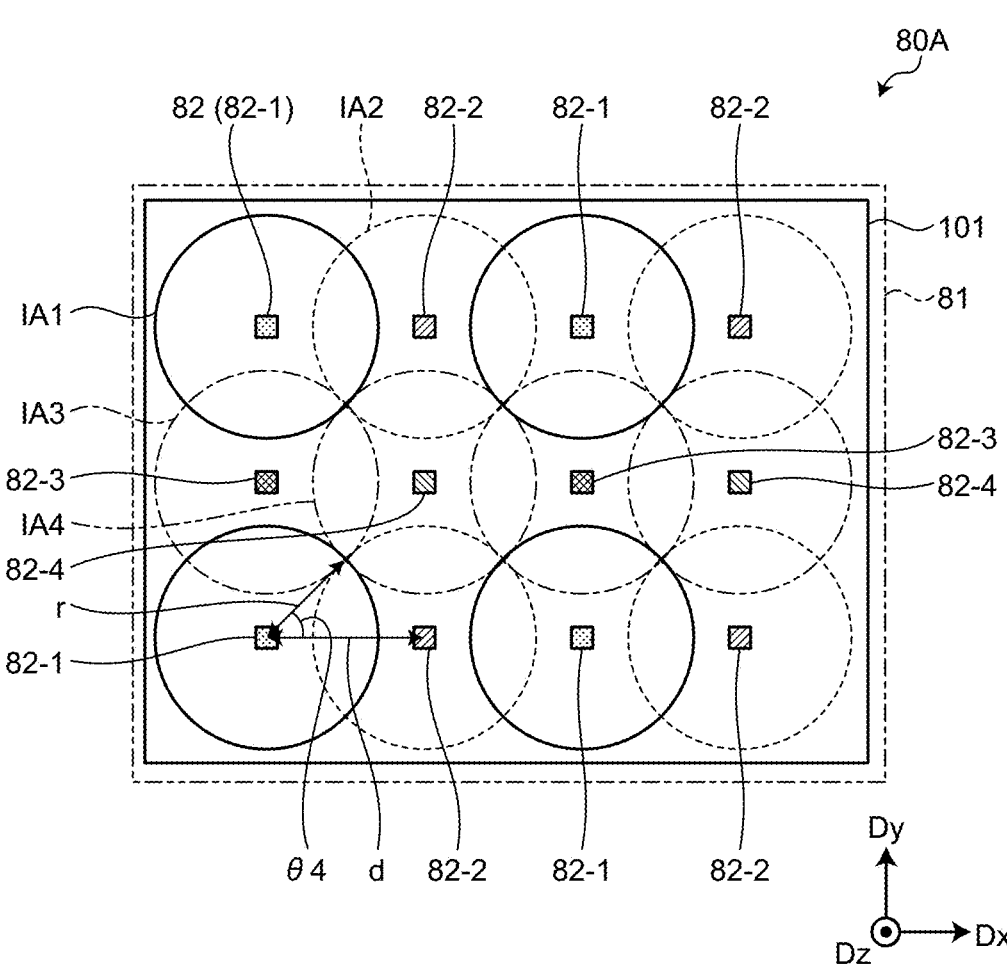
FIG. 13 is an explanatory view for schematically explaining a relation of the light-emitting elements with the irradiated areas in the detection device according to a modification.
Figure 14:
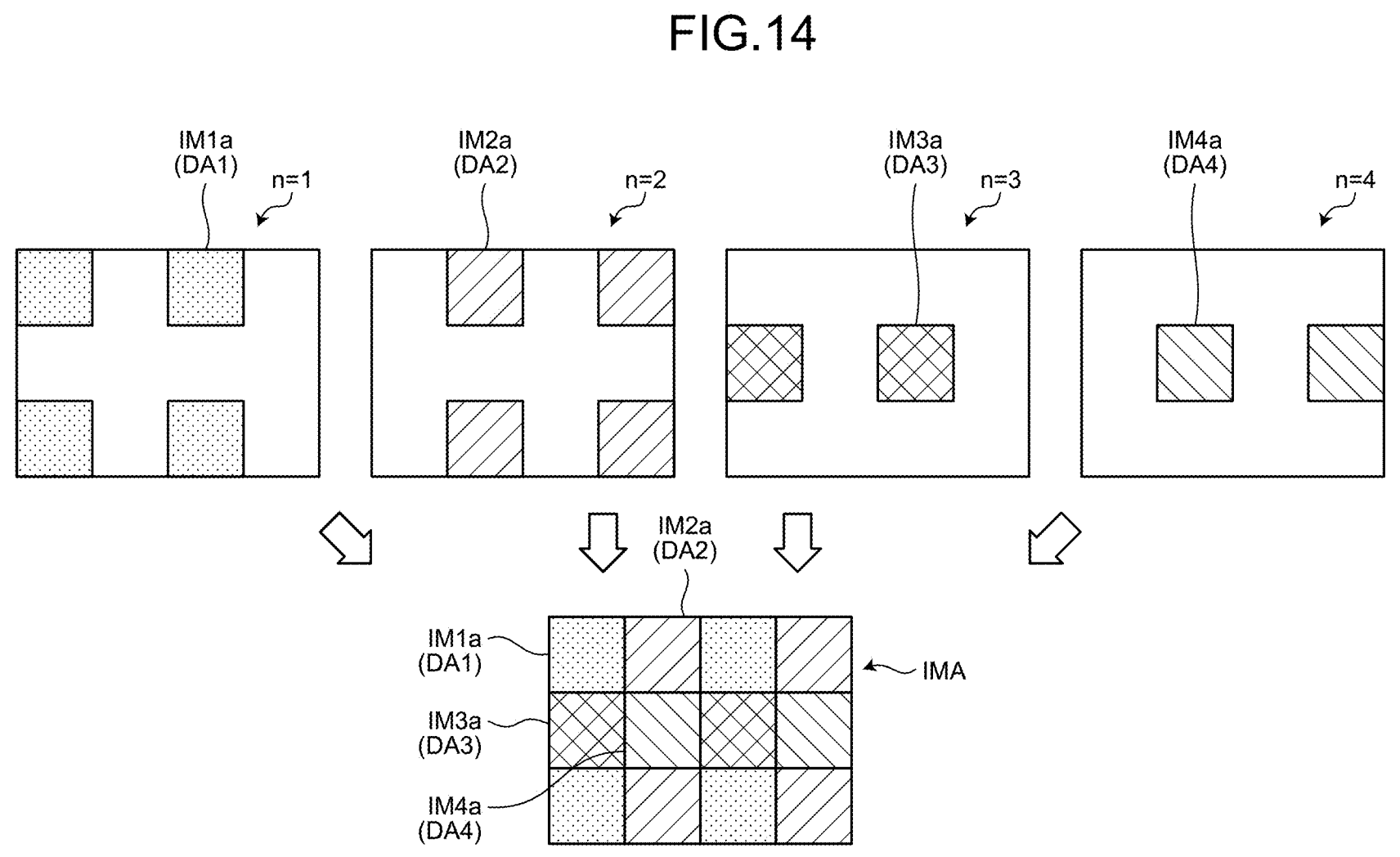

FIG. 13 is an explanatory view for schematically explaining a relation of the light-emitting elements with the irradiated areas in the detection device according to a modification. FIG. 14 illustrates explanatory views for explaining a method for generating the entire image by combining the divided images in the detection device according to the modification.

As illustrated in FIG. 13, in the modification, the light-emitting elements 82 include a plurality of light-emitting elements 82-4 (fourth light sources) arranged adjacent to the light-emitting elements 82-1, 82-2, and 82-3. The light-emitting elements 82-1, 82-2, 82-3, and 82-4 are separately arranged in a grid pattern (rectangular arrangement).

In also the present modification, the light-emitting elements 82-1, 82-2, 82-3, and 82-4 are arranged such that irradiated areas IA1, IA2, IA3, and IA4 cover the entire placement substrate 101. The irradiation radius r of the irradiated areas IA1, IA2, IA3, and IA4 and the arrangement pitch d of the light-emitting elements 82 satisfy Expression (2) below.

$$d \leq 2 \times r \times \cos(45°) = \sqrt{2} \times r \qquad (2)$$

As illustrated in FIG. 14, assigned areas DA1, DA2, DA3, and DA4 that are set correspondingly to the irradiated areas IA1, IA2, IA3, and IA4, are quadrilateral.

In also the present modification, in the same way as the detection method described with reference to FIG. 10, the divided images IM1, IM2, and IM3 are generated in the first, the second, and the third periods corresponding to the light-emitting element numbers n=1, n=2, and n=3. The light source device 80 (refer to FIG. 2) turns on the light-emitting element 82-1 and turns off the light-emitting elements 82-2, 82-3, and 82-4 during the period corresponding to the light-emitting element number n=1 (first period). The light source device 80 turns on the light-emitting element 82-2 and turns off the light-emitting elements 82-1, 82-3, and 82-4 during the period corresponding to the light-emitting element number n=2 (second period). The light source device 80 turns on the light-emitting element 82-3 and turns off the light-emitting elements 82-1, 82-2, and 82-4 during the period corresponding to the light-emitting element number n=3 (third period).

In the respective periods, the divided images IM1, IM2, and IM3 are generated by cutting out quadrilateral portions corresponding to the irradiated areas IA1, IA2, and IA3 (that is, by cutting out the portions corresponding to the projected areas PA1, PA2, and PA3 of the optical sensor 10), respectively. Furthermore, the image processing circuit 79 reduces the size of the divided images IM1, IM2, and IM3 to generate the divided images IM1a, IM2a, and IM3a after the image processing. The divided images IM1a, IM2a, and IM3a after the image processing have substantially the same shape and area as those of the assigned areas DA1, DA2, and DA3, respectively.

The present modification further includes a period corresponding to the light-emitting element number n=4 (fourth period). During the period corresponding to the light-emitting element number n=4, the light source device 80 (refer to FIG. 2) turns on the light-emitting element 82-4 corresponding to the light-emitting element number n=4 and turns off the light-emitting elements 82-1, 82-2, and 82-3 other than the light-emitting element 82-4. The optical sensor 10 scans the photodiodes 30 in the entire detection area AA.

The divided image generation circuit 72 (refer to FIG. 2) generates a divided image IM4 (not illustrated) by cutting out a quadrilateral portion corresponding to the irradiated area IA4 irradiated by the lit-up light-emitting element 82-4 (that is, by cutting out a portion corresponding to a projected area PA4 of the optical sensor 10 (not illustrated)) from the image based on the sensor values So obtained by scanning the entire detection area AA. The divided images IM4 are generated correspondingly to the light-emitting elements 82-4 and stored in the storage circuit 73 together with information on position coordinates of the light-emitting elements 82-4 (irradiated areas IA4).

The image processing circuit 79 (refer to FIG. 2) also reduces the size of the divided images IM4. As illustrated in the right view of FIG. 14, a divided image IM4a after the image processing has substantially the same shape and area as those of the assigned area DA4 set correspondingly to the irradiated area IA4 by the light-emitting element 82-4.

The image generation circuit 76 (see FIG. 2) generate the overall image IMA by combining the divided images IM1a, IM2a, IM3a, and IM4a after the image processing of reducing the size thereof.

The arrangement of the light-emitting elements 82 is merely exemplary, and other arrangements may be employed. The number of periods during which the light-emitting elements 82 are turned on in a time-division manner may be five or larger.

Second Embodiment

Figure 15:
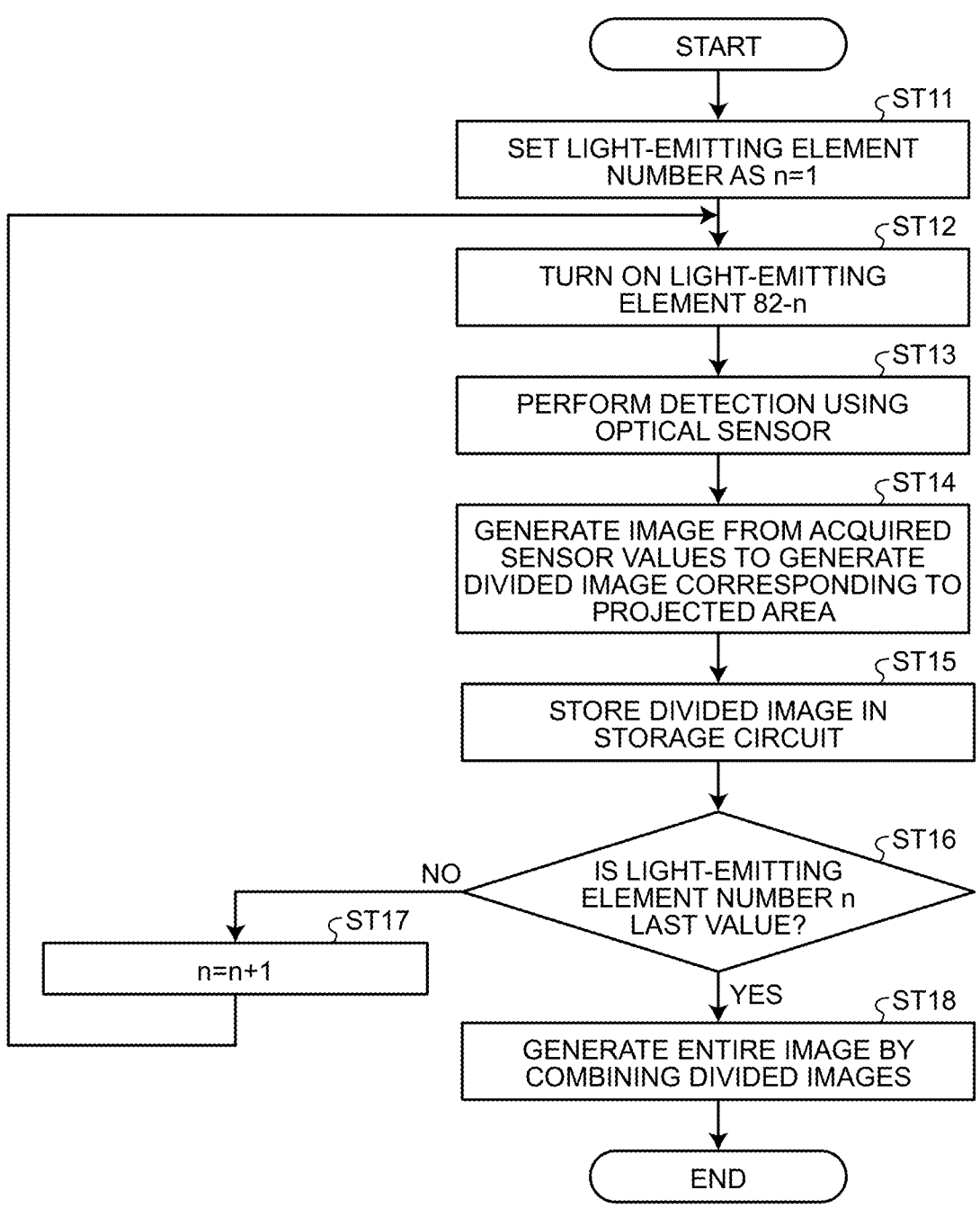
FIG. 15 is a flowchart illustrating a detection method of the detection device according to a second embodiment.

FIG. 15 is a flowchart illustrating a detection method of the detection device according to a second embodiment. Steps ST11 to ST14 and Steps ST16 and ST17 illustrated in FIG. 15 are the same as Steps ST1 to ST4 and Steps ST6 and ST7 in FIG. 10 of the first embodiment described above, and will not be repeatedly described.

The detection device of the second embodiment generates, for example, the divided image IM1 for the light-emitting element number n=1 at Step ST14, and then, stores the divided image IM1 in the storage circuit 73 without reducing the size of the divided image IM1 (Step ST15). The divided images IM2 and IM3 are generated and stored in the storage circuit 73 by performing the processing described above repeatedly until the light-emitting element number n reaches the last value (for example, n=3).

The image generation circuit 76 (refer to FIG. 2) generates an entire image IMB by combining the divided images IM1, IM2, and IM3 that have not undergone the image processing (size reduction) (Step ST18).

Figure 16:
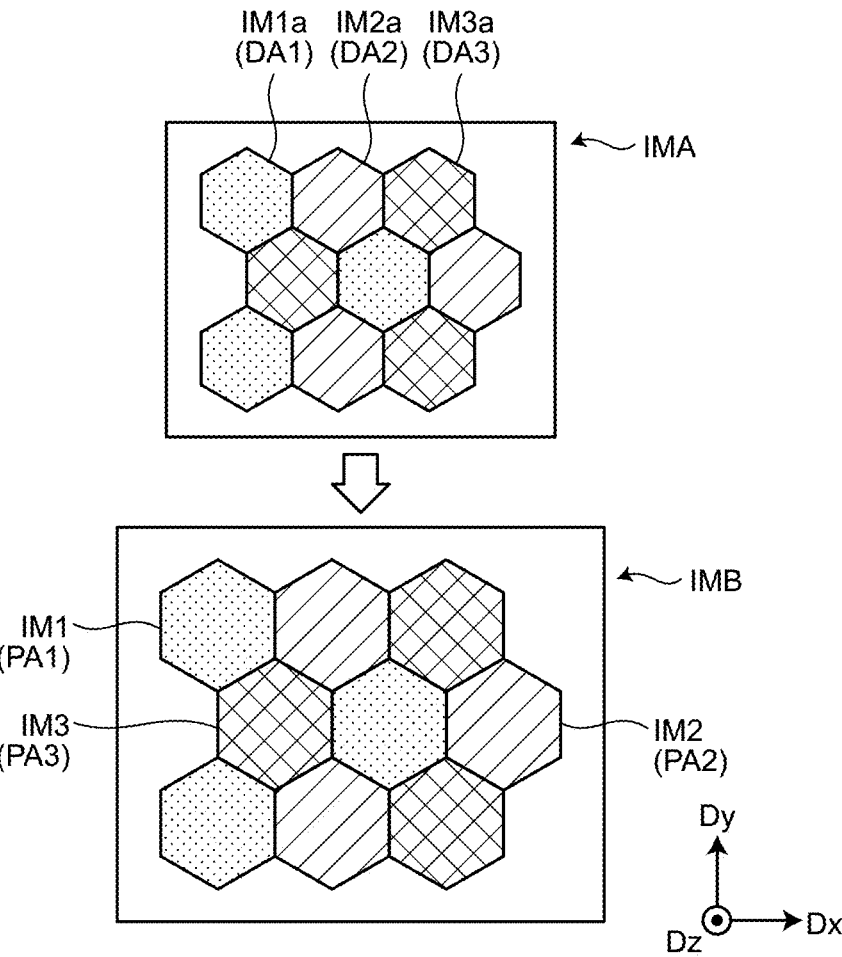
FIG. 16 illustrates explanatory views for explaining a method for generating the entire image by combining the divided images in the detection device according to the second embodiment.

FIG. 16 illustrates explanatory views for explaining a method for generating the entire image by combining the divided images in the detection device according to the second embodiment. FIG. 16 illustrates the entire image IMB generated in the second embodiment in comparison with the entire image IMA generated in the first embodiment.

The divided images IM1, IM2, and IM3 generated at Step ST14 are generated by cutting out the portions corresponding to the projected areas PA1, PA2, and PA3 of the optical sensor 10 (refer to FIG. 9) from the image based on the sensor values So obtained by scanning the photodiodes 30 in the entire area. The projected areas PA1, PA2, and PA3 have larger shapes and areas than those of the assigned areas DA1, DA2, and DA3 corresponding to the irradiated areas IA1, IA2, and IA3, respectively. Therefore, when the divided images IM1, IM2, and IM3 are superimposed as they are, outer edges thereof overlap one another.

As illustrated in FIG. 16, in the present embodiment, when generating the entire image IMB, the positions of the divided images IM1, IM2, and IM3 are shifted and combined so as to form no overlapping portions of the divided images IM1, IM2, and IM3. That is, while maintaining the shapes and areas of the divided images IM1, IM2, and IM3 corresponding to the projected areas PA1, PA2, and PA3, the adjacent divided images IM1, IM2, and IM3 are combined together in the state of increased distances between the centroids thereof. When h1 denotes the distance between each of the light-emitting elements 82 and the placement substrate 101 and h2 denotes the distance between each of the light-emitting elements 82 and the optical sensor 10, the magnification ratio of the distances between the centroids of the adjacent divided images IM1, IM2, and IM3 to the distances between the centroids of the adjacent assigned areas DA1, DA2, and DA3 is set as h2/h1×100(%). In this way, the positions of the divided images IM1, IM2, and IM3 are adjusted so that the sides of the divided images IM1, IM2, and IM3 are in contact with one another.

Third Embodiment

Figure 17:
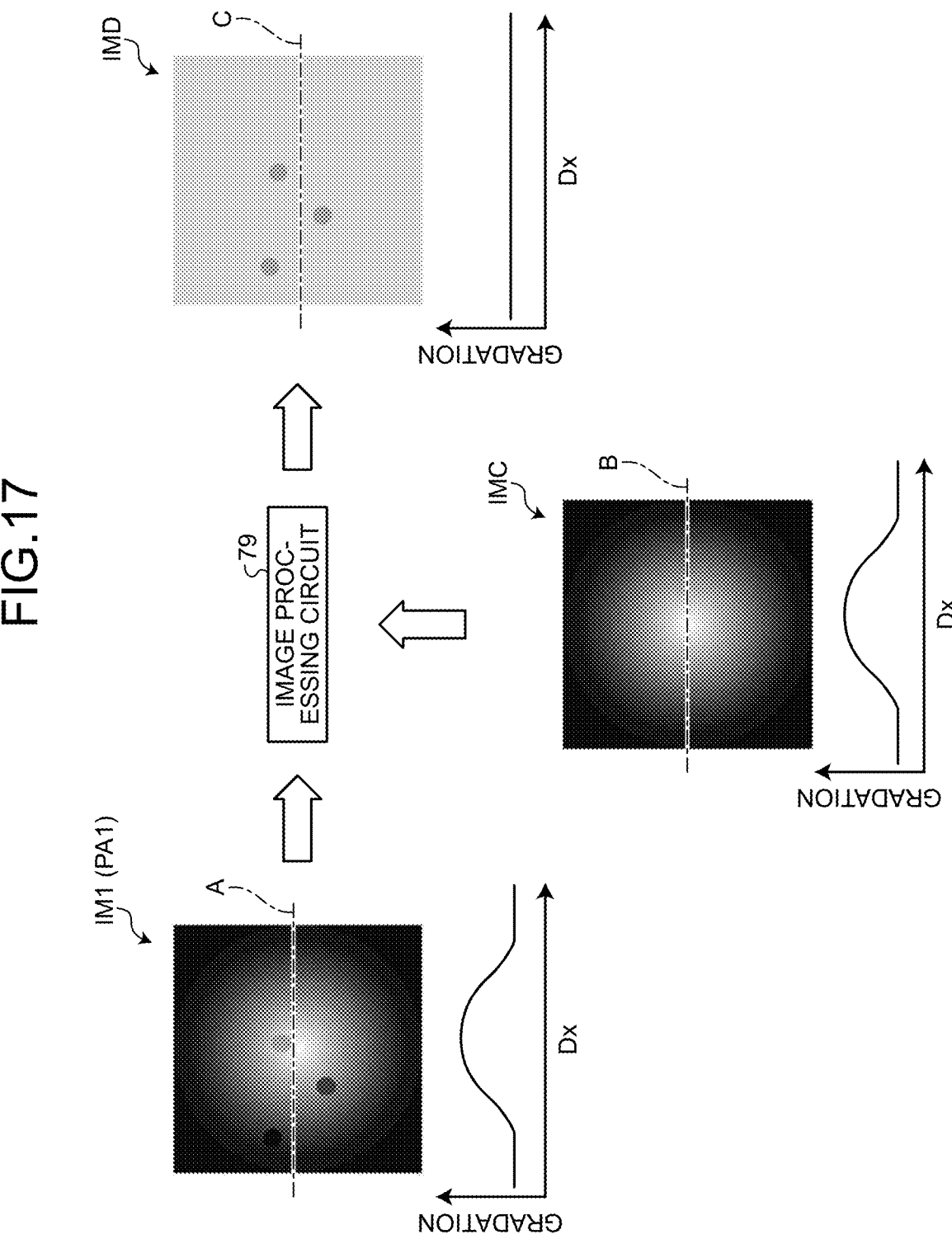
FIG. 17 is an explanatory diagram for explaining a method for adjusting luminance of a divided image in the detection device according to a third embodiment.

FIG. 17 is an explanatory diagram for explaining a method for adjusting luminance of the divided image in the detection device according to a third embodiment. FIG. 17 schematically illustrates gradation distributions along the long dashed short dashed lines A, B, and C for the divided image IM1 (left diagram of FIG. 17), luminance gradient data IMC (center diagram of FIG. 17), and an adjusted divided image IMD (right diagram of FIG. 17).

As illustrated in the left diagram of FIG. 17, the divided image IM1 generated at Step ST4 (refer to FIG. 10) may have a gradation distribution depending on the distance from the light-emitting element 82. For example, the divided image IM1 becomes brighter as the position is closer to the center of the divided image IM1, that is, as the position is closer to the center of the light-emitting element 82. The divided image IM1 becomes darker toward the periphery of the divided image IM1, that is, as the position is farther from the center of the light-emitting element 82. In this case, the object to be detected 100 may not be detected well depending on the position in the divided image IM1.

In the detection device 1 according to the third embodiment, the storage circuit 73 stores therein the luminance gradient data IMC illustrated in the center diagram of FIG. 17. The luminance gradient data IMC is information on luminance corresponding to the distance from each of the light-emitting elements 82 in plan view. The luminance gradient data IMC is information acquired based on the divided image IM1 acquired for the placement substrate 101 and the culture medium 102 in the absence of the object to be detected 100. The storage circuit 73 also stores therein information on adjustment values based on the luminance gradient data IMC in advance. Adjustment gradations Lc are calculated based on Expression (3) below and stored in the storage circuit 73.

$$Lc(x) = \left(Ls(x)/Lp(x)\right) \times S \qquad (3)$$

In Expression (3), x is a pixel coordinate in the first direction Dx. Lc is the adjustment gradation. Ls is an acquired gradation acquired based on the divided image IM1. Lp is a reference gradation distribution based on the luminance gradient data IMC. S is an adjusting coefficient.

The image processing circuit 79 (refer to FIG. 2) adjusts the luminance of the divided image IM1 based on the luminance gradient data IMC. In more detail, the image processing circuit 79 (refer to FIG. 2) integrates the adjustment gradations Lc stored in the storage circuit 73 in advance to the divided image IM1 generated at Step ST4 (see FIG. 10) to obtain the adjusted divided image IMD (right diagram of FIG. 17) having a adjusted gradation distribution. In the adjusted divided image IMD, the gradation distribution characteristics of the background are effectively constant regardless of the position, thus obtaining a gradation corresponding to the transmittance of the object to be detected 100 regardless of the position. The detection device 1 according to the third embodiment can improve the detection accuracy.

Fourth Embodiment

Figure 18:
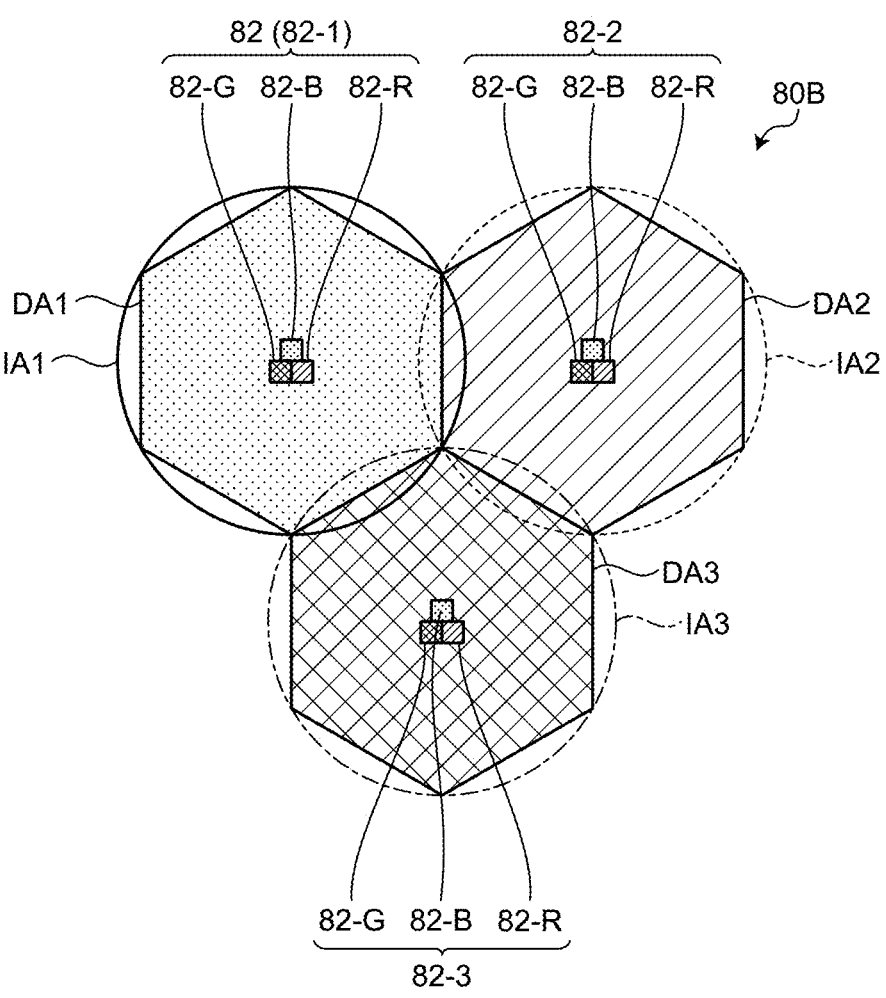
FIG. 18 is a plan view schematically illustrating the light-emitting elements of the detection device according to a fourth embodiment.

FIG. 18 is a plan view schematically illustrating the light-emitting elements of the detection device according to a fourth embodiment. As illustrated in FIG. 18, in the detection device 1 according to the fourth embodiment, the light-emitting elements 82 of a light source device 80B each include a light-emitting element 82-R (first sub-light source), a light-emitting element 82-G (second sub-light source), and a light-emitting element 82-B (third sub-light source). The light-emitting element 82-R emits red light. The light-emitting element 82-G emits green light. The light-emitting element 82-B emits blue light. The light-emitting elements 82-R, 82-G, and 82-B are arranged in a delta pattern. However, the light-emitting elements 82-R, 82-G, and 82-B are not limited to being arranged in such a way, and may be arranged to be lined up in this order. The arrangement of the light-emitting elements 82-R, 82-G, and 82-B is not limited to these arrangements, and can be changed as appropriate. The light-emitting elements 82 may have four or more colors.

In the present embodiment, the detection method described above with reference to FIG. 10 is executed for each of the light-emitting elements 82-R, 82-G, and 82-B. That is, for the light-emitting elements 82-R, the light-emitting elements 82-R of the light-emitting elements 82-1, the light-emitting elements 82-R of the light-emitting elements 82-2, and the light-emitting elements 82-R of the light-emitting elements 82-3 are turned on in a time-division manner, and the optical sensor 10 performs the detection during the respective periods. The image generation circuit 76 then combines together the divided images IM acquired in the respective periods to generate the entire image IMA corresponding to the light-emitting elements 82-R.

Then, for the light-emitting elements 82-G, the light-emitting elements 82-G of the light-emitting elements 82-1, the light-emitting elements 82-G of the light-emitting elements 82-2, and the light-emitting elements 82-G of the light-emitting elements 82-3 are turned on in a time-division manner, and the optical sensor 10 performs the detection during the respective periods. The image generation circuit 76 then combines together the divided images IM acquired in the respective periods to generate the entire image IMA corresponding to the light-emitting elements 82-G.

Then, for the light-emitting elements 82-B, the light-emitting elements 82-B of the light-emitting elements 82-1, the light-emitting elements 82-B of the light-emitting elements 82-2, and the light-emitting elements 82-B of the light-emitting elements 82-3 are turned on in a time-division manner, and the optical sensor 10 performs the detection during the respective periods. The image generation circuit 76 then combines together the divided images IM acquired in the respective periods to generate the entire image IMA corresponding to the light-emitting elements 82-B.

The image generation circuit 76 generates a color image by combining together the entire images IMA corresponding to the respective light-emitting elements 82-R, 82-G, and 82-B.

The order of the lighting periods of the respective light-emitting elements 82-R, 82-G, and 82-B, and the order of the lighting periods of the respective light-emitting elements 82-1, 82-2, and 82-3 may be any combination.

While the preferred embodiments have been described above, the present disclosure is not limited to the embodiments described above. The content disclosed in the embodiments is merely an example and can be variously modified within the scope not departing from the gist of the present disclosure. Any modifications appropriately made within the scope not departing from the gist of the present disclosure also naturally belong to the technical scope of the present disclosure. At least one of various omissions, substitutions, and changes of the components can be made without departing from the gist of the embodiments and the modification described above.

What is claimed is:

1. A detection device comprising:
a planar detection device comprising a plurality of photodetection elements arranged in a planar configuration;
a light-transmitting placement substrate to place thereon a plurality of objects to be detected; and
a plurality of light sources provided correspondingly to the photodetection elements,
wherein the planar detection device, the placement substrate, and the light sources are arranged in the order as listed,
wherein the light sources comprise a plurality of first light sources that are separately arranged and a plurality of second light sources that are arranged adjacent to the respective first light sources,
wherein the detection device has:
a first period in which the first light sources are on and the second light sources are off; and
a second period in which the second light sources are on and the first light sources are off, and
wherein the detection device is configured to combine a first image detected by the planar detection device in the first period with a second image detected by the planar detection device in the second period.

2. The detection device according to claim 1,
wherein the light sources comprise a plurality of third light sources arranged adjacent to the respective first light sources and the respective second light sources, and
wherein the detection device has:
the first period in which the first light sources are on, and the second light sources and the third light sources are off;
the second period in which the second light sources are on, and the first light sources and the third light sources are off; and
a third period in which the third light sources are on, and the first light sources and the second light sources are off, and
wherein the detection device is configured to combine together the first image detected by the planar detection device in the first period, the second image detected by the planar detection device in the second period, and a third image detected by the planar detection device in the third period.

3. The detection device according to claim 2,
wherein the light sources are arranged in a staggering manner.

4. The detection device according to claim 2, comprising a divided image generation circuit configured to generate a divided image based on a sensor value from each of the photodetection elements in each of the first period, the second period, and the third period, wherein the divided image generation circuit is configured to generate a plurality of the divided images by cutting out hexagonal portions corresponding to irradiated areas of the turned-on light sources from the images generated based on the sensor values from the photodetection elements.

5. The detection device according to claim 4,
wherein the divided image generation circuit is configured to generate the divided images by cutting off portions of the image corresponding to overlapping portions of the irradiated areas of the adjacent light sources.

6. The detection device according to claim 4, comprising a division processing circuit configured to reduce a size of each of the divided images in accordance with a distance between the light sources and the planar detection device and a distance between the light sources and the placement substrate in a direction orthogonal to a surface of the planar detection device.

7. The detection device according to claim 4,
wherein the divided images corresponding to the irradiated areas of the light sources have larger planar shapes than those of the irradiated areas, and
wherein when combining together the divided images acquired in a plurality of periods, the adjacent divided images are combined by shifting positions of the divided images so as to form no overlapping portions.

8. The detection device according to claim 4,
wherein each of the light sources comprises sub-light sources for emitting light in a plurality of colors, and the divided images are acquired in a plurality of periods for the respective sub-light sources for emitting light in the colors and combined together.

9. The detection device according to claim 8,
wherein the sub-light sources in the colors comprise a first sub-light source configured to emit red light, a second sub-light source configured to emit green light, and a third sub-light source configured to emit blue light.

10. The detection device according to claim 1,
wherein the light sources comprise a plurality of third light sources and a plurality of fourth light sources arranged adjacent to the respective first light sources and the respective second light sources, and
wherein the detection device has:
the first period in which the first light sources are on, and the second light sources, the third light sources, and the fourth light sources are off;
the second period in which the second light sources are on, and the first light sources, the third light sources, and the fourth light sources are off;
a third period in which the third light sources are on, and the first light sources, the second light sources, and the fourth light sources are off; and
a fourth period in which the fourth light sources are on, and the first light sources, the second light sources, and the third light sources are off, and
wherein the detection device is configured to combine together the first image detected by the planar detection device in the first period, the second image detected by the planar detection device in the second period, a third image detected by the planar detection device in the third period, and a fourth image detected by the planar detection device in the fourth period.

11. The detection device according to claim 10,
wherein the light sources are arranged in a grid pattern.

12. The detection device according to claim 10, comprising a divided image generation circuit configured to generate a divided image based on a sensor value from each of the photodetection elements in each of the first period, the second period, the third period, and the fourth period, wherein the divided image generation circuit is configured to generate a plurality of the divided images by cutting out quadrilateral portions corresponding to irradiated areas of the turned-on light sources from the images generated based on the sensor values from the photodetection elements.

13. The detection device according to claim 12, wherein the divided image generation circuit is configured to generate the divided images by cutting off portions of the image corresponding to overlapping portions of the irradiated areas of the adjacent light sources.

14. The detection device according to claim 12, comprising a division processing circuit configured to reduce a size of each of the divided images in accordance with a distance between the light sources and the planar detection device and a distance between the light sources and the placement substrate in a direction orthogonal to a surface of the planar detection device.

15. The detection device according to claim 12, wherein the divided images corresponding to the irradiated areas of the light sources have larger planar shapes than those of the irradiated areas, and wherein when combining together the divided images acquired in a plurality of periods, the adjacent divided images are combined by shifting positions of the divided images so as to form no overlapping portions.

16. The detection device according to claim 12, wherein each of the light sources comprises sub-light sources for emitting light in a plurality of colors, and the divided images are acquired in a plurality of periods for the respective sub-light sources for emitting light in the colors and combined together.

17. The detection device according to claim 16, wherein the sub-light sources in the colors comprise a first sub-light source configured to emit red light, a second sub-light source configured to emit green light, and a third sub-light source configured to emit blue light.

18. The detection device according to claim 1, wherein an arrangement pitch of the light sources is 1 mm to 20 mm.

19. The detection device according to claim 1, wherein a distance between each of the light sources and the planar detection device is 4 mm to 80 mm in a direction orthogonal to a surface of the planar detection device.

20. The detection device according to claim 1, comprising a storage circuit to store therein luminance gradient data corresponding to a distance from each of the light sources in plan view, wherein image luminance is adjusted based on the luminance gradient data.

* * * * *